(12) United States Patent
Smith et al.

(10) Patent No.: US 7,537,947 B2
(45) Date of Patent: May 26, 2009

(54) OPTOELECTRONIC DISPLAYS

(75) Inventors: Euan Christopher Smith, Cambridge (GB); Alec Gordon Gunner, Horseheath (GB); Jonathan J. M. Halls, Cambridge (GB)

(73) Assignee: Cambridge Display Technology Limited, Cambridgeshire (GB)

( * ) Notice: Subject to any disclaimer, the term of this patent is extended or adjusted under 35 U.S.C. 154(b) by 207 days.

(21) Appl. No.: 10/488,419

(22) PCT Filed: Aug. 29, 2002

(86) PCT No.: PCT/GB02/03935

§ 371 (c)(1),
(2), (4) Date: Aug. 26, 2004

(87) PCT Pub. No.: WO03/021340

PCT Pub. Date: Mar. 13, 2003

(65) Prior Publication Data

US 2004/0263045 A1    Dec. 30, 2004

(30) Foreign Application Priority Data

Aug. 30, 2001   (GB)   ................. 0121077.2

(51) Int. Cl.
*H01L 21/00* (2006.01)
(52) U.S. Cl. .............. 438/29; 438/28; 257/59; 257/72; 257/88; 257/98; 257/103
(58) Field of Classification Search ............ 257/59, 257/75, E25.032, 72, 92, 98, 103, 79, 80, 257/88; 345/204, 208, 210, 214; 438/28, 438/29
See application file for complete search history.

(56) References Cited

U.S. PATENT DOCUMENTS

| | | | |
|---|---|---|---|
| 3,649,867 A | 3/1972 | Chester et al. | 315/12 |
| 4,539,507 A | 9/1985 | VanSlyke et al. | 313/504 |
| 5,424,560 A | 6/1995 | Norman et al. | 257/40 |
| 5,568,417 A | 10/1996 | Furuki et al. | 365/106 |
| 5,684,365 A | 11/1997 | Tang et al. | 315/169.3 |

(Continued)

FOREIGN PATENT DOCUMENTS

DE       100 42 974 A1    3/2002

(Continued)

OTHER PUBLICATIONS

"Effects of Electric Field on ZnSe/ZnS Strained-Layer Superlattices", Yokogawa et al., Journal of Crystal Growth 101, 1990, pp. 550-553.

(Continued)

*Primary Examiner*—Phuc T Dang
*Assistant Examiner*—Thanh Y Tran
(74) *Attorney, Agent, or Firm*—Marshall, Gerstein & Borun LLP

(57) ABSTRACT

Apparatus and methods for providing displays based upon the principle of photoluminescent quenching are described. The invention includes a method of displaying information using photoluminescence quenching, the method comprising providing an optoelectronic display comprising a photoluminescent material between a pair of electrodes, providing illumination for the photoluminescent material to cause the photoluminescent material to photoluminescence, and biasing the electrodes to at least partially quench the photoluminescence.

78 Claims, 10 Drawing Sheets

U.S. PATENT DOCUMENTS

| | | | |
|---|---|---|---|
| 5,828,429 A | 10/1998 | Takemura | 349/42 |
| 5,903,246 A | 5/1999 | Dingwall | 345/82 |
| 5,965,901 A | 10/1999 | Heeks et al. | 257/40 |
| 6,072,450 A * | 6/2000 | Yamada et al. | 345/76 |
| 6,091,382 A * | 7/2000 | Shioya et al. | 345/76 |
| 6,124,046 A | 9/2000 | Jin et al. | 428/690 |
| 6,201,520 B1 | 3/2001 | Iketsu et al. | 345/76 |
| 6,667,729 B2 | 12/2003 | Redecker | 345/82 |
| 2002/0027537 A1 | 3/2002 | Redecker | 345/82 |

FOREIGN PATENT DOCUMENTS

| | | |
|---|---|---|
| GB | 2312326 A | 10/1997 |
| JP | H07-08453 | 3/1995 |
| JP | H11-124573 | 5/1999 |
| JP | 2000-321994 | 11/2000 |
| WO | WO 90/13148 | 11/1990 |
| WO | WO 95/06400 | 3/1995 |
| WO | WO 98/05187 | 2/1998 |
| WO | WO 98/41065 | 9/1998 |
| WO | WO 98/59529 | 12/1998 |
| WO | WO 99/42983 | 8/1999 |
| WO | WO 99/48160 | 9/1999 |
| WO | WO 01/42331 A1 | 6/2001 |
| WO | WO 01/55927 A1 | 8/2001 |

OTHER PUBLICATIONS

"Dynamics of Photoexcitations in Electric Fields in Poly(p-phenylenevinylene) Diodes", Lemmer et al., Synthetic Metals 67, 1994, pp. 169-172.

"Electric Field-Induced Photoluminescence Quenching in Molecularly Doped Polymer Ligh-Emitting Diodes", Deussen et al., Chemical Physics 207, 1996, pp. 147-157.

"An Analysis of Photoluminescence Voltage Quenching and Band Structure of Nanoporous Silicon", Parkinson et al., Thin Solid Films 326, 1998, pp. 194-200.

"Theory of Luminescence Quenching and Photobleaching in Conjugated Polymers", De Jong et al., Philips J. Res. 51, 1998, pp. 495-510.

"Late-News Paper: AMLCDs Using Organic Thin-Film Transistors on Polyester Substrates", Kane et al., SID 01 Digest, 2001, pp. 57-59.

"Invited Paper: All-Polymer Thin Film Transistors Fabricated by High-Resolution Ink-Jet Printing", Kawase et al., SID 01 Digest, 2001, pp. 40-43.

International Search Report in PCT/GB02/03935 dated Mar. 28, 2003.

International Preliminary Examination Report in PCT/GB02/03935 dated Jul. 31, 2003.

"Photoluminescence Quenching Under Reverse Bias in Organic Multilayer Structure Utilizing 8-Hydroxyquinoline Aluminum and Aromatic Diamine", Fujii et al., Jpn. J. Appl. Phys., vol. 33, 1994, pp. L348-L350.

Search Report in GB 0121077.2 dated Apr. 18, 2002.

Japanese Office Action (English translation) for corresponding Japanese application No. 2003-525365, dated Sep. 16, 2008 (3 pp).

* cited by examiner

OPTOELECTRONIC DISPLAYS

This is the U.S. national phase of International Application No. PCT/GB02/03935 filed Aug. 29, 2002, the entire disclosure of which is incorporated herein by reference.

FIELD OF THE INVENTION

This invention generally relates to displays and display drivers, and more particularly to apparatus and methods for providing displays based upon the principle of photoluminescence quenching.

BACKGROUND TO THE INVENTION

A broad range of optoelectronic display devices is known, ranging from incandescent lamps and light emitting diodes through to liquid crystal and plasma displays and cathode ray tubes. A particularly important category of displays is pixellated displays and, for low power applications, liquid crystal displays, (LCDs) are generally the technology of choice. Known LCD displays operate in transmissive mode, for example using a back light, reflective mode, for example illuminated by daylight, and transflective mode in which the pixels have both reflective and transmissive elements. However despite their popularity LCD displays still suffer from a number of problems which, even after many years of research, have not been fully overcome. Thus generally speaking LCD displays are relatively slow, with switching times of the order of milliseconds, and have a relatively limited viewing angle. LCDs displays can also suffer from viewing artefacts such as display inversion at certain viewing angles, and have a relatively unexciting visual appearance as compared with emissive display technologies. Furthermore since LCD displays are passive displays operating by blocking either transmitted or reflected light they have an upper efficiency limit which is reduced in colour displays by the need for coloured filters.

Emissive display technologies overcome many of the above described problems and can provide a wide viewing angle and a bright, colourful and interesting display with fewer visual artefacts. Known emissive display technologies include cathode ray tubes, plasma display panels, thin film electro-luminescent displays, and organic light emitting diodes (OLEDs), but a general problem with emissive displays is their relatively high power consumption which makes them unsuitable for many applications, and in particular, for many portable applications.

There therefore exists a general need to improve upon conventional displays and to address the above problems, particularly the problems of power consumption and viewability.

Organic light emitting diodes (OLEDs) provide many advantages over better known display technologies including ease of fabrication and flexibility in the design of new materials for displays. Organic LEDs have been know for around ten years and can be based on either conjugated polymers or on smaller molecules although, generally speaking, the main features of devices based upon both these materials are similar.

Typically an organic LED comprises a substrate on which a series of layers is deposited including a pair of electrode layers to serve as an anode and cathode and, between these, a layer of electroluminescent organic material. Optionally a hole-transporting layer is incorporated between the anode and the electroluminescent layer and/or an electron transport layer is incorporated between the electroluminescent layer and the cathode. Generally heterostructures used for inorganic LEDs can be also be adapted for organic LEDs.

In the case of polymer-based devices materials such as PPV (poly(p-phenylenevinylene)) may be used for the electroluminescent layer whilst in the case of smaller molecule devices this layer may comprise materials such as aluminium trisquinoline. The hole-transporting layer may comprise PEDOT (doped polyethylene dioxythiophene) in the polymer-based devices or triarylamines in the smaller molecule devices. The electron-transporting layer may comprise oxadiazoles in the smaller molecule devices; there is generally no electron transporting layer in the polymer devices. The anode typically has a higher work function than the cathode and is normally transparent to allow light to escape from the electroluminescent layer, often ITO (indium tin oxide) is used for the anode.

Organic LEDs switch much faster than LCDs, typically in less than one microsecond. The flexibility of organic chemistry also makes it relatively straight forward to synthesise new active materials for organic LEDs as compared with inorganic LEDs, for example to allow tuning of the organic material's semiconductor band gap. A further advantage of polymer LEDs is that they are relatively straight forward to fabricate since deposition of the active layer can be performed at room temperature using, for example, spin coating. Organic LEDs can also be formed on flexible substrates and patterned simply by pixellation of one of the electrodes.

Further details of organic LED-based devices may be found in WO90/13148, WO98/59529, WO99/48160, WO95/06400, GB 2,312,326A, and U.S. Pat. No. 5,965,901, all in the name of the present applicant, and all of which are hereby incorporated by reference.

Notwithstanding the significant advantages which organic LEDs provide over more conventional display technologies, there is still a need for lower power consumption display devices with longer lifetimes.

The present invention stems from research work carried out into organic light emitting diodes but is based upon an entirely new principle in the field of optoelectronic displays. In particular, the applicant has recognised that the electroluminescent materials normally used in organic light emitting diodes are usually also photoluminescent and that this photoluminescence may be reduced or quenched by applying an electric field to the photoluminescent material when incorporated in a suitable structure. Suitable structures include conventional OLED structures and the electric field necessary to quench the photoluminescence can be applied to the photo- (or electro-)luminescent material simply by reverse biassing the OLED device, although this photoluminescence quenching effect is difficult to observe under ordinary circumstances. The applicants have also recognised that the idea of using photoluminescence quenching to display information is not, in principle limited to the device structure and materials used for organic LEDs but could also be applied to device structures and materials used for inorganic LEDs.

WO98/41065 discloses the application of either polarity of driving voltage to an electroluminescent polymer-based display to drive either red light emission from an interface of the polymer or green light emission from the bulk of the polymer. However, in both cases, the light emitting semiconductor is forward biassed (the device effectively comprises two back-to-back diodes). U.S. Pat. No. 6,201,520 describes the use of reverse biassing for non selected pixels in a pixellated OLED display to prevent cross talk which could otherwise be caused by the (electrically) semi-excited state of the non-selected pixels. U.S. Pat. No. 5,965,901 describes the use of a pulse driving scheme for an organic light-emitting polymer device to improve device lifetime in which positive pulses are separated by negative (reverse bias) pulses. U. Lemmer et. al., Synthetic Metals, 67 (1994) 169-172 describes the experimental observation of photoluminescence quenching in an ITO/PPV/Al structure. However none of these prior art documents discloses a display based upon the photoluminescence quenching principle or the use of photoluminescence quenching to provide a display.

SUMMARY OF THE INVENTION

According to a first aspect of the present invention there is therefore provided a method of displaying information using photoluminescence quenching, the method comprising providing an optoelectronic display comprising a photoluminescent material between a pair of electrodes; providing illumination for the photoluminescent material to cause the photoluminescent material to photoluminesce; and biasing the electrodes to at least partially quench said photoluminescence.

Displaying information using photoluminescence combines the durability advantages of emissive display technologies with the low power consumption of reflective and transflective LCD displays. Since the method relies on the control or modulation of photoluminescence it is best categorised as an emissive technology and is capable of providing the advantages associated with such technology, namely bright saturated colours and a Lambertian emission profile—that is an output intensity which is substantially constant over a range of angles, which assists in achieving a wide viewing angle. However because only a small current is needed to quench the photoluminescence the power consumed by this method of displaying information can be very low.

Although an illumination source is needed, this illumination may be provided by ambient illumination such as daylight, and the method thus provides the further advantage of good display viewability in bright conditions. Alternatively where a light source associated with the optoelectronic display is used to provide the illumination, this light source can itself be selected for high efficiency. In either case for many materials the photoluminescence efficiency is far greater than the electroluminescence efficiency, typically greater than 80% as compared with 1 to 5% for electroluminescence. The illumination for the photoluminescence material may be visible, for example blue, or invisible, for example ultraviolet, but should have a wavelength less than or equal to the photoluminescence wavelength. Thus green illumination, for example, is adequate for a yellow or red display.

A further advantage, at least insofar as concerns organic photoluminescence materials, is the potential for increased device lifetime. In a conventional electroluminescent OLED display electro-migration plays a significant factor in the eventual degradation of the organic electroluminescer. The contrast in the present method when organic photoluminescent material is biased so as to quench the photoluminescence much less current flows and this decay mechanism becomes less important. A further consequence is that many more materials are available for use for displaying information using photoluminescence quenching than are available for conventional electroluminescent displays since materials which may have a relatively short lifetime under forward bias may still exhibit an acceptably long lifetime when biased to quench the photoluminescence.

The method may be used with any photoluminescent material, either organic (large or small molecule), organometallic or inorganic, such as gallium arsenide or some other III-V or II-VI material However when organic materials are employed the above described benefits of OLED technology, relating to material synthesis and device fabrication, may also be realised.

In preferred embodiments of the method the optoelectronic display is an active matrix display such as a thin-film-transistor (TFT)-driven display, or a DC driven display. Using a TFT-driven display simplifies interfacing and, because the photoluminescence quenching switches off very quickly, facilitates achieving a good display contrast.

Preferably, the photoluminescent material comprises an organic photoluminescent material such as a small molecule or a semiconducting conjugated organic polymer. Fluorine-based organic materials are particularly preferable because of their high photoluminescent efficiency.

In a preferred embodiment the pair of electrodes comprises a cathode and an anode, the cathode having a lower work function than the anode. The anode may be formed from ITO or a metal such as gold or silver; the cathode may be formed from a metal such as aluminium, calcium or lithium. Preferably the device is then reverse biased to make the anode more negative than the cathode. When reverse biased in this way the power consumption may be little more than that required to conduct away photo-excited holes and electrons to quench the photoluminescence. In a preferred variant the optoelectronic display also includes a hole transport material between the photoluminescent material and the anode to increase the efficiency of photoluminescence quenching.

Preferably at least one of the electrodes is at least partially transparent as it simplifies construction of the device and allows provision of a relatively large display surface area. However side-emitting embodiments are also possible. Where at least one electrode is at least partially transparent, this electrode may also be used for illuminating the photoluminescent material, although the material may also be illuminated directly. An electrode need not cover the entire surface of the photoluminescent material and one of the electrodes may be confined to a spot or region of the device but the photoluminescence quenching will only occur where an anode and cathode overlap.

In one embodiment of the method ambient or background light, such as daylight or interior room lighting, may be used to provide the illumination. Alternatively illumination may be provided by a dedicated light source such as a back or preferably front-light. In still other embodiments of the method both forms of illumination may be employed and/or a dedicated source of illumination may be employed according to the level of ambient or background illumination. Where a back- or front-light is employed it is preferable that both electrodes are at least partially transparent, although this is not necessary where side illumination is employed. Where artificial illumination is employed this may be selected for its high efficiency and/or high output at wavelengths stimulating the photoluminescence. In some embodiments a light absorbing material may be incorporated into the optoelectronic display to at least partially absorb the illumination and hence increase the contrast between the photoluminescence and any background or scattered portion of said illumination.

Where the optoelectronic display extends over an area the illumination may be arranged to be generally perpendicular to the display area, for example by shining light on the device from the side or from to one side at the front or back of the device. However one particularly preferred embodiment of the method involves illuminating the photoluminescent material by waveguiding light through the substrate on which the device is mounted. For example where the photoluminescent layer is sandwiched between a substantially transparent and a reflecting electrode the illuminating light may be waveguided between the reflecting electrode and a front surface (towards an observer) of the substrate, the device being mounted on the back surface of the substrate. The substrate may be made of, for example, glass or plastic. The illuminating light may be conducted in from one or more sides of the device.

Using waveguided illumination has the advantage of being able to substantially confine the illumination within the waveguiding region so that an observer sees the photoluminescence without any significant visible background from the illumination. This helps to increase the contrast in the display. The illumination preferably employs light having a wavelength less than or equal to the photoluminescence wavelength, for example light with a wavelength shorter than 500 nm, or shorter than 450 nm, or shorter than 400 nm, or shorter than 350 nm.

It will be appreciated that where any form of dedicated light source or artificial illumination is used to illuminate the photoluminescent material the relative contrast may be improved by using light of a colour or wavelength to which the human eye is relatively less sensitive. Thus, for example, the sensitivity of the human eye falls away rapidly below 450 nm and therefore by using illumination with a wavelength or peak wavelength in this region the effect of any background or scattered illumination on the photoluminescence display may be attenuated.

In one embodiment of the method a photoluminescent material is employed which becomes substantially colourless when the photoluminescence is quenched. Although, in practice, the photoluminescence may not be entirely quenched, by using a material which becomes or which would become substantially colourless when the photoluminescence is quenched or not present the effect of any intrinsic colour of the photoluminescent material on the display is reduced. Thus, for example, where the photoluminescent material is strongly coloured this may be apparent under ambient light or under illumination when the photoluminescence is reduced or turned off. This can cause the apparent colour of the display to change between an "on" photoluminescent state and an "off" reduced-photoluminescence state, which may not be desirable for some applications. Thus it is generally preferable to use a photoluminescent material which, at least to the human eye, is intrinsically substantially colourless.

In one embodiment a photoluminescent material is used which comprises a blend of materials with different photoluminescent colours. This allows the display of "colours" which do not correspond to a pure single wavelength emission. Thus in one embodiment a blend of materials which photoluminesces with a substantially white "colour" may be employed. This facilitates a black and white display which is advantageous for, for example, word processing.

In one embodiment the method uses a plurality of photoluminescence display elements each having an associated pair of electrodes between which photoluminescent material is located. Thus, for example, an x-y matrix of electrodes may be employed or a single common anode may be employed with a separate cathode for each display element. Such an arrangement allows a pixellated display and where two or more different photoluminescent materials are employed which photoluminesce with different colours a multi-coloured display can be provided. For example, a pixellated OLED-type display device structure may be illuminated and reverse biased to provide a colour photoluminescence quenching-type display. Optionally, but preferably, each pixel has one or more associated transistors and/or one or more capacitors to allow the pixel to be maintained in a photoluminescence quenching state whilst another pixel is addressed.

In another embodiment of the method where the photoluminescent material is also electroluminescent the optoelectronic display may be operated in a dual mode by, in effect, forward biassing the photo/electroluminescent material when the display is in an "on state" to enhance the light emitted from the display. In this case, however, it is preferable to employ photoluminescent materials which have usefully long electroluminescent lifetimes.

In one embodiment the method further comprises providing the optoelectronic display with an optical structure to collect and deliver light to the photoluminescent material. This is particularly advantageous where the illumination comprises ambient light illumination. The optical structure preferably comprises a micro structure such as a micro-lens array. In such an optical micro structure the lens or feature size is generally less than 1 mm, and often less than 0.1 mm, less than 10 micrometers or even less than 1 micrometer.

In a second aspect the invention provides a use of an optoelectronic display comprising a photoluminescent material between a pair of electrodes to display information, the use comprising illuminating the photoluminescent material to stimulate photoluminescence and; applying a voltage to the electrodes to quench the photoluminescence to display information.

Preferably the display comprises a diode and the applied voltage reverse biases the diode. Ambient light alone, without additional dedicated illumination, may be employed to illuminate the photoluminescent material or a dedicated illumination source may be used to stimulate the photoluminescence, or one or other of these illumination methods may be selected according to, for example, the ambient light level.

In a related aspect the invention provides a use of a display driver to drive a light emitting display to display information, the light emitting display comprising a photoluminescent material between a pair of electrodes, the display driver applying a voltage of a first polarity to the electrodes to reduce photoluminescence from the material to switch the light emission off and applying a reduced voltage at the first polarity, or substantially zero voltage, to the electrodes to switch the light emission on.

The voltage may be applied to reduce or substantially quench the photoluminescence. It will be appreciated that, depending upon the application, the light emission may only be switched "off" by comparison with a strongly emitting "on" state, and that to switch the display light emission off does not necessarily imply reducing photoluminescent emission to zero.

The use may further comprise modulating or changing a pulse width or duty cycle of the applied voltage to control the photoluminescence. Thus the applied reverse bias voltage may be pulse-width modulated to provide the effect of an adjustable level of photoluminescence quenching. In such an arrangement, the applied voltage is switched between a first level and a second level to provide a pulse train with an adjustable mark:space ratio. The first voltage level may correspond to substantially zero applied voltage and the second voltage level to reverse bias, for example to reduce or substantially quench the photoluminescence.

The voltage is switched between these two levels at such a rate that, to the human eye, the switching is not apparent and instead the effect is to vary the apparent degree of photoluminescence quenching dependent upon the mark:space ratio of the pulse train. Switching frequencies of 25 Hz or greater, preferably, 60 or 100 Hz or greater are sufficient. Where a "space" corresponds to substantially quenched photoluminescence and a "mark" to a substantially full-on display, a mark:space ratio of 50% provides a half-on display and the display may be varied between fully on and fully off by varying the mark:space ratio between 100% and 0%. In this way, a grey-level display may be provided.

In another aspect the invention provides a method of operating a photoluminescent device, the device comprising a semiconductor layer in the form of a film of organic photoluminescent material, a first electrical contact layer proximate a first surface of the semiconductor layer, and a second electrical contact layer proximate a second surface of the semiconductor layer, the method comprising illuminating the device and applying an electric field between the first and second contact layers across the semiconductor layer so as to render the second contact layer negative relative to the first contact layer to split optically excited excitons generated by the illumination into their constituent holes and electrons and to conduct said holes and electrons out of said photoluminescent film to inhibit photoluminescence from said film.

By conducting the optically excited excitons out of the photoluminescence film the recombination of the holes and the electrons is inhibited, and thus the photoluminescence is attenuated. Where the organic photoluminescent material comprises a conjugated polymer the semi-conductor band gap is typically in the range of 1 eV to 3.5 eV.

As described above the method may further comprise illuminating the device by the guiding light between the first and second contact layers. Preferably the device is illuminated from the side, that is approximately perpendicular to the display surface, and particularly preferably the light is guided within the substrate, which is transmissive at the illumination and photoluminescence wavelengths. The illumination must be of a shorter wavelength than the desired photoluminescence and it is therefore preferable that the illumination is towards the blue end of the spectrum to facilitate the production of a range of photoluminescence colours. Ultraviolet illumination may be employed, with the advantage that such illumination will not be visible, although ultraviolet illumination sources have drawbacks related to cost, efficiency and safety. Generally the illumination source may be selected according to cost and power consumption and the desired wavelength of photoluminescent emission.

Preferably the first contact layer has a lower work function than the second contact layer so that, relatively speaking, the first contact layer is the better electron injecting material and the second contact layer the better hole injecting material (under forward bias). This facilitates removal of the charge carriers from the photoluminescent layer when the device is reverse biased to reduce or quench the photoluminescence.

In a preferred embodiment the film of organic material comprises a thin, dense polymer film, that is, the polymer film is not fibrillar and is substantially free of voids. Preferably the film is also relatively free of defects which act as non-radiative recombination centres as such defects will tend to reduce the overall photoluminescent efficiency. One or both of the contact layers may include an additional hole or electron transport layer, preferably of an organic material. The polymer may comprise a single conjugated polymer or a single co-polymer containing segments of conjugated polymer or a blend of conjugated polymer or co-polymer with another suitable polymer.

Other generally preferred features of the organic material are physical and chemical stability and processability.

Since the purpose of the first and second contact layers is to apply an electric field across the device, it will be recognised that there is not necessarily a requirement for a direct electrical connection between these layers and the film of organic photoluminescence material itself. Providing that holes and electrons resulting from optically excited excitons can be inhibited from recombining this is sufficient to provide photoluminescence reduction or quenching. Thus, for example, the separated holes and electrons could leak away or be drained away to prevent radiative recombination. A direct electrical connection is preferable however to reduce the driving voltage required.

In another aspect the invention provides an optoelectronic display device comprising: a semiconductor layer in the form of a film of organic photoluminescent material, a first electrical contact layer proximate a first surface of the semiconductor layer, and a second electrical contact layer proximate a second surface of the semiconductor layer; and a light source to illuminate said photoluminescent material to stimulate photoluminescence from the material.

The invention also provides an optoelectronic display comprising a photoluminescent display device having a display on-state in which the display emits photoluminescence under optical illumination with no voltage applied to the device and a display off-state in which said photoluminescence is at least partially quenched; and device driver circuitry having an input for receiving a display signal and an output for driving said display device, said display signal having an on-state indicating that the display is to be on and an off-state indicating that the display is to be off; said photoluminescent display device comprising a semiconductor layer in the form of a film of organic photoluminescent material, a first electrical contact layer proximate a first surface of the semiconductor layer, and a second electrical contact layer proximate a second surface of the semiconductor layer; and wherein said device driver circuitry is configured to apply an electric field between the first and second contact layers across the semiconductor layer so as to render the second contact layer negative relative to the first contact layer to split optically excited excitions generated by the illumination into their constituent holes and electrons and to conduct said holes and electrons out of said photoluminescent film to inhibit photoluminescence from said film in response to said display signal having said off-state; said display device and device driver combination primarily operating to display information by photoluminescence quenching.

In one embodiment the device driver circuitry is further configured to reduce, but not to reverse, the electric field in response to the display signal having its "on" state. The photoluminescence quenching need not be complete since in some circumstances a reduced contrast display with only partial photoluminescence quenching may be acceptable. The degree of photoluminescence quenching may be varied either by varying the electric field, that is, by providing a variable amount of negative bias on the display device or by varying the waveform of the applied voltage. The device driver circuitry may either provide a single-ended or differential output for driving the photoluminescence display.

The device driver circuitry may also incorporate means to drive one or more display pixels with a pulse-width modulated signal to provide an adjustable level of photoluminescence quenching. Thus the device driver circuitry may incorporate means to receive an input signal specifying a desired level of photoluminescence and means responsive to the input signal to drive a pixel of the display with a pulse train with a mark-space ratio dependent upon the input signal.

In a still further aspect the invention provides an optoelectronic display comprising a semiconductor layer in the form of a film of organic photoluminescent material, a first electrical contact layer proximate a first surface of the semiconductor layer, and a second electrical contact layer proximate a second surface of the semiconductor layer; and a region to channel illumination from a light source using internal reflection, to illuminate said photoluminescent material.

Preferably the illumination is channelled using total internal reflection, using either step or graded index waveguiding. The display may also incorporate means such as a cylindrical lens to couple light into the waveguiding region.

In another aspect the invention provides an optoelectronic display comprising a semiconductor layer in the form of a film of organic photoluminescent material, a first electrical contact layer proximate a first surface of the semiconductor layer and a second electrical contact layer proximate a second surface of the semiconductor layer, a substrate carrying said semiconductor layer and said first and second contact layers; and an optical structure on said substrate to collect and deliver light from said photoluminescent material to a viewer of the display.

Preferably the optical structure comprises a plurality of microlenses. This assists in collecting ambient light and in directing photoluminescent emitted light towards an observer of the display.

In another aspect the invention provides a pixellated optoelectronic display comprising a plurality of photoluminescent display devices each associated with a pixel of the display and having a pair of electrodes for addressing the device and device driver circuitry for driving the electrodes to control the display, the pixels of the display having a normally-on photoluminescence emissive state under zero bias across the electrodes, the display driver circuitry being configured to apply bias voltage to inhibit said photoluminescent emission from selected pixels of the display, to thereby display information.

The invention also provides optoelectronic device driver circuitry as described above.

In a further aspect the invention provides an optoelectronic display as operating on the principle of quenched photoluminescence, the display comprising a first electrode, a second electrode; and a visible display element located between the first and second electrodes, the display element comprising photoluminescent material, the device being configured to at least partially quench photoluminescence from said photoluminescent material upon application of a voltage between said first and second electrodes and thereby visibly change from a photoluminescent emissive state to a reduced emissivity state to provide a visual display.

The invention further provides a combination of an optoelectronic display device and instructions for use of the device, the display device comprising a semiconductor layer in the form of a film of organic photoluminescent material, a first electrical contact layer proximate a first surface of the semiconductor layer, and a second electrical contact layer proximate a second surface of the semiconductor layer the instructions comprising instructions to apply an electric field between the first and second contact layers across the semiconductor layer so as to render the second contact layer negative relative to the first contact layer to inhibit photoluminescence from said photoluminescent film.

BRIEF DESCRIPTION OF THE DRAWINGS

These and other aspects of the invention will now be further described, by way of example only with reference to the accompanying figures in which:

FIG. 9 shows photoluminescent intensity as a function of illumination wavelength for the device of FIG. 8a.

DETAILED DESCRIPTION OF PREFERRED EMBODIMENTS

Figure 1A:
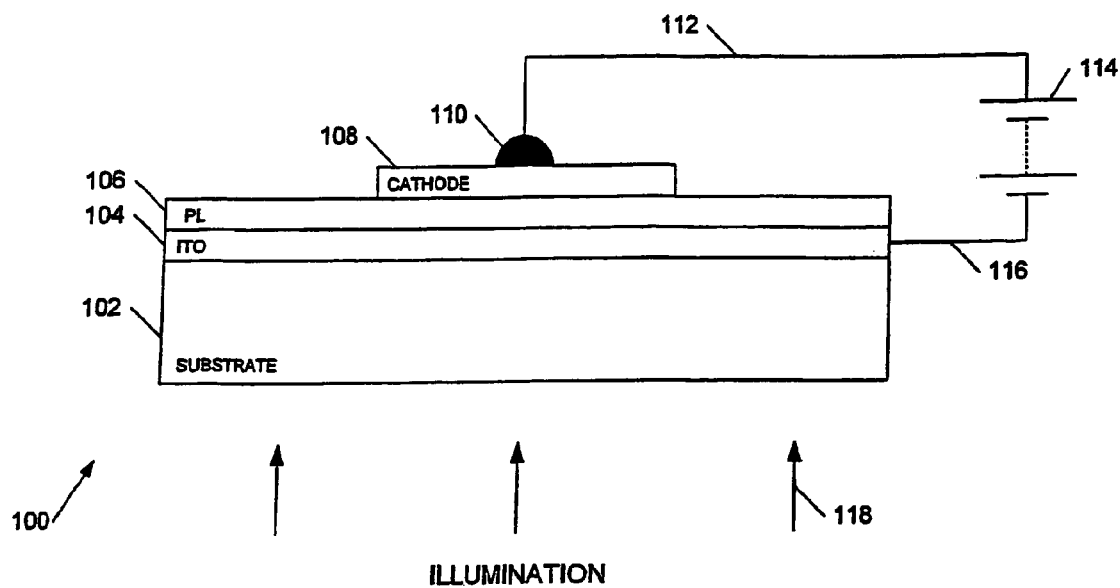
FIGS. 1a and 1b show photoluminescence quenching device structures.

Referring first to FIG. 1a, this shows a cross section through the structure of a basic device 100 suitable for use in a photoluminescence quenching display. The structure of the device is the same as that of a known organic light emitting diode as described in the prior art documents mentioned in the introduction to the application. This is because, generally speaking, most organic LEDs will function as a photoluminescence quenching display when reverse biased. However in practice it may preferable to choose materials for use in a photoluminescence quenching display according to a slightly different set of parameters than that generally used for OLEDs, as explained in more detail below. The fabrication techniques normally applied in constructing OLEDs are also suitable for constructing photoluminescence quenching displays.

In the basic device of FIG. 1a a glass substrate 102 supports an anode layer 104, typically comprising indium tin oxide (ITO), which has good transparency, low sheet resistance and established processing routes. A layer of photoluminescent material 106 is deposited on anode layer 104, the photoluminescent material comprising a conjugated organic polymer, or polymer blend, or a conjugated polymer doped with a photoluminescent material. Since virtually all electroluminescent materials are also photoluminescent conventional electroluminescent materials using organic LEDs may also be employed in layer 106. Thus, for example, layer 106 may comprise PPV (poly(p-phenylenevinylene)). A cathode layer 108 is deposited over photoluminescent material layer 106 and a contact wire 112 is bonded to the cathode, for example using silver dag 110 (electrically conducting paint) containing colloidal silver. A similar connection (not shown) is made by contact wire 116 to anode layer 104. Anode layer 104 has a relatively high work function, for example between 4 eV and 5.2 eV, whilst cathode 108 has a relatively low work function, for example less than 3.5 eV. A power supply, illustratively shown by battery 114, reverse biases this conventional OLED structure, applying a positive voltage to cathode 108 and a negative voltage to anode 104.

The photoluminescent layer 106 is illuminated by light 118 passing through the transparent substrate 102 and the transparent anode 104. Either a dedicated light source or background light or daylight may be employed for illumination. Under quiescent conditions, with no applied voltage, light 118 causes photoluminescent layer 106 to luminesce and this photoluminescence is visible through substrate 102 and anode 104. Thus in the illustrated embodiment substrate 102 forms the front face of the display and the quiescent condition of the display is "on" or light-emitting. In practice the appearance of the display may depend both upon the colour and intensity of photoluminescence and upon the intrinsic colour of photoluminescent layer 106, that is the colour this layer would appear were the photoluminescence not present. The contribution of the intrinsic colour of photoluminescent layer 106 to the display colour depends, in part upon how much of incident illumination 118 is scattered back towards an observer of the display.

When, as shown in FIG. 1a, the conventional OLED structure is reverse biased the photoluminescence from layer 106 is at least partially quenched resulting in a dimming of the display and where the quenching is complete, the display is switched off. However the display is not necessarily colourless or black when switched off as some residual, intrinsic colour from photoluminescent layer 106 for some residual reflectance from cathode 108 or other layers of the device may be present.

Figure 1B:
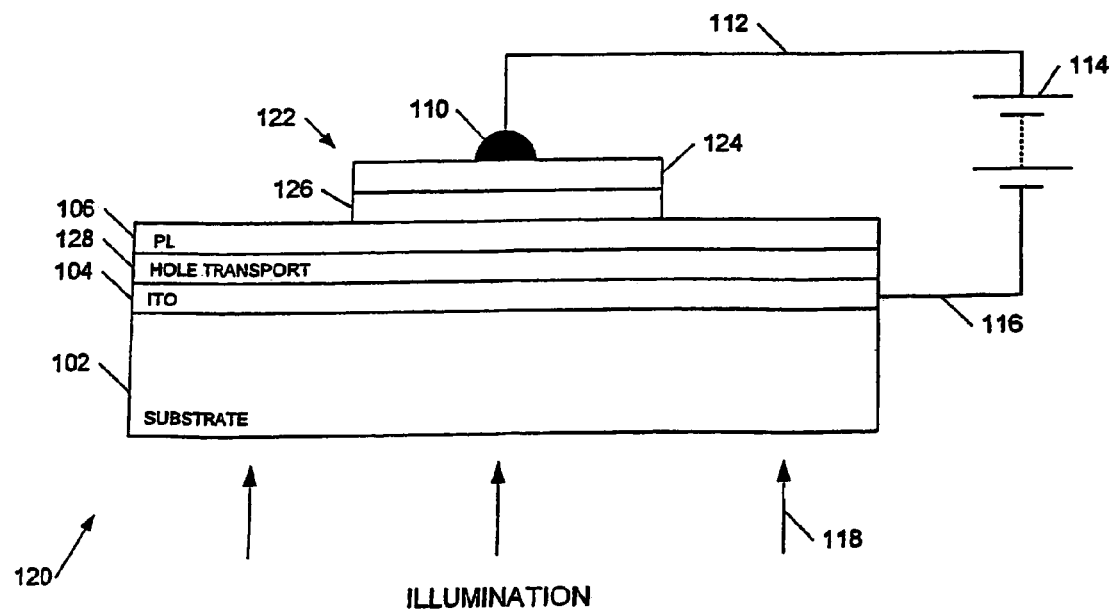

FIG. 1a shows a cross-section through a simple photoluminescence quenching device but, in practice, a more complex structure as illustrated by the cross-section of FIG. 1b is often preferable. In FIG. 1b an additional hole transport layer 128 is present between anode layer 104 and photoluminescent layer 106. This hole transport layer helps match the hole energy levels of the photoluminescent layer with those of the anode layer 104. A number of such hole transport layers may be provided and, in a similar way, one or more electron transport layers may be provided between the cathode and the photoluminescent layer. In FIG. 1b cathode 122 comprises two layers, a first layer 124 having a low work function, for example a metal such as magnesium or aluminium, and a second layer 126 having a still lower work function, for example a metal such as calcium, lithium or barium or a metal fluoride. Combinations of metals, such as for example a LiAl combination, may also be used. This helps to match the electron energy levels in the cathode and photoluminescent layer.

Any or all of hole and electron transporting layers and multilayer cathodes and anodes may be employed.

The anode preferably has a work function of greater than 4.3 eV, and may comprise indium oxide or indium tin oxide or a thin, partially transmissive high work function metallic anode such as a thin film of gold or silver. Other materials such as fluorine-doped tin oxide and aluminium-doped zinc oxide can also be used, although it is preferable that the sheet resistant of the anode is low, preferably less than 100 Ohms/square, more preferably less than 30 Ohms/square. Metallic layers of 20 nm thickness, and more generally less than 50-100 nm have been found to be sufficiently optically transparent. Other metals such as aluminium, may, however, also be employed and in some embodiments, for example where the cathode rather than the anode is at least partially transparent, the anode need not be transparent.

The cathode preferably has a work function of less than 3.5 eV and may comprise, for example, barium, calcium, lithium, samariom, ytterbium, terbium, aluminium or an alloy comprising one or more of these metals with or without another metal. Like the anode the cathode may be made at least partially optically transmissive by depositing only a thin film of metal.

Although metals and metal-based compounds are convenient for use in the anode and cathode, other materials such as conducting polymers and doped semi-conductors may also be employed. Preferably electrode materials should have a registivity of less than 10,000 Ohm cm, more preferably less than 1,000 Ohm cm. The anode and cathode materials are preferably also selected so that electrons and holes are not injected into the photoluminescent layer 106 when a reverse bias is applied to the device as this could cause electroluminescent emission and breakdown.

The hole transport layer 128 may comprise polystyrene-sulphonate-doped polyethylene dioxythiophene (PEDOT: PSS—poly(ethylenedioxythiophene):poly(styrenesulphonic acid)) as for example described in UK patent application number 9703172.8. However other materials may also be used and in particular other polymers such as poly(2,7-(9,9-di-n-octylfluorene)-(1,4-phenylene-(4-imino(benzoic acid))-1,4-phenylene-(4-imino(benzoic acid))-1,4-phenylene)) ("BFA") and/or polyaniline (doped, undoped or partially doped) and/or PPV.

The photoluminescent layer 106 may comprise a photoluminescent conjugated organic polymer or polymer blend or a conjugated polymer doped with a photoluminescent material. Alternatively a so-called small molecule such as tris-(8-hydroxyquinolino aluminium)("Alq3") as described in U.S. Pat. No. 4,539,507, may be employed. Suitable polymer materials include PPV, poly(2-methoxy-5-(2'-ethyl)hexyloxyphenylenevinylene)("MEH-PPV"), a PPV derivative (e.g. a di-alkoxy or di-alkyl derivative), a polyfluorene and/or a co-polymer incorporating polyfluorene segments, PPVs and/or related co-polymers, poly (2,7-(9,9-di-n-octyfluorene)-(1,4-phenylene-((4-secbutylphenyl)imino)-1,4-phenylene))("PFB"), ("TFB") poly(2,7-(9,9-di-n-octylfluorene)-(1,4-phenylene-((4-methylphenyl)imino)1,4-phenylene-((4methylphenyl) imino)-1,4-phenylene))("PFM"), poly(2,7-(9,9-di-n-octyfluorene)-(1,4-phenylene-((4-methoxyphenyl)imino)-1,4-phenylene-((4-methoxyphenyl)imino-14-phenylene)) ("PFMO"), poly (2,7-(9,9-di-n-octyfluorene) ("F8") or poly (2,7-(9,9-di-n-octylfluorene)-3,6-Benzothiadiazole) ("F8BT"). Further suitable materials and parameters for their selection are described below with reference to FIG. 2.

The substrate 102 provides mechanical support and electrical insulation for anode layer 104 and, in the embodiments of FIGS. 1a and b, is transparent to allow photoluminescent layer 106 to be viewed. Suitable substrate materials include glass and clear plastics such as polyethylene or PET. Other suitable substrate materials include polyvinylidene fluoride and polyimide.

The illuminating light 118 may be red, green, blue, ultraviolet, or substantially white but must include sufficient wavelength components to excite photoluminescent emission of the required colour. Generally photoluminescent emission is at a longer wavelength than the exciting illumination, and different display colours may therefore require different wavelengths of illuminating light—illumination with a blue or shorter wavelength component is required for blue photoluminescence whilst, for example green illumination may be sufficient for red photoluminescence.

Conventional organic LED fabrication techniques may be employed to construct the devices of FIGS. 1a and b. Thus the anode and cathode electrode layers may be deposited by methods such as evaporation and RF and DC sputtering whilst the organic photoluminescence layer 106 and optional hole transport layer 128 may be deposited by spin coating or for larger areas, draw-coating or other techniques such as dip-coating, blade coating, miniscus-coating and self-assembly. The resulting pixels are around 100 nm thick. So called "small molecules" may also be deposited by sublimation.

The organic layers may also be deposited by ink-jet printing which has the advantage of facilitating patterning of the photoluminescent layer. Conventional ink-jet printing process polymers may be employed to give the necessary control of surface tension and viscosity. A suitable ink-jet printer spraying cycle is 14,400 drops per second, with a drop volume of 30 pl. Ink jet printing is especially suitable for multi-colour displays. Where a conductive polymer is used as one of the electrodes this may also be deposited by an ink-jet printing process.

Figure 2A:
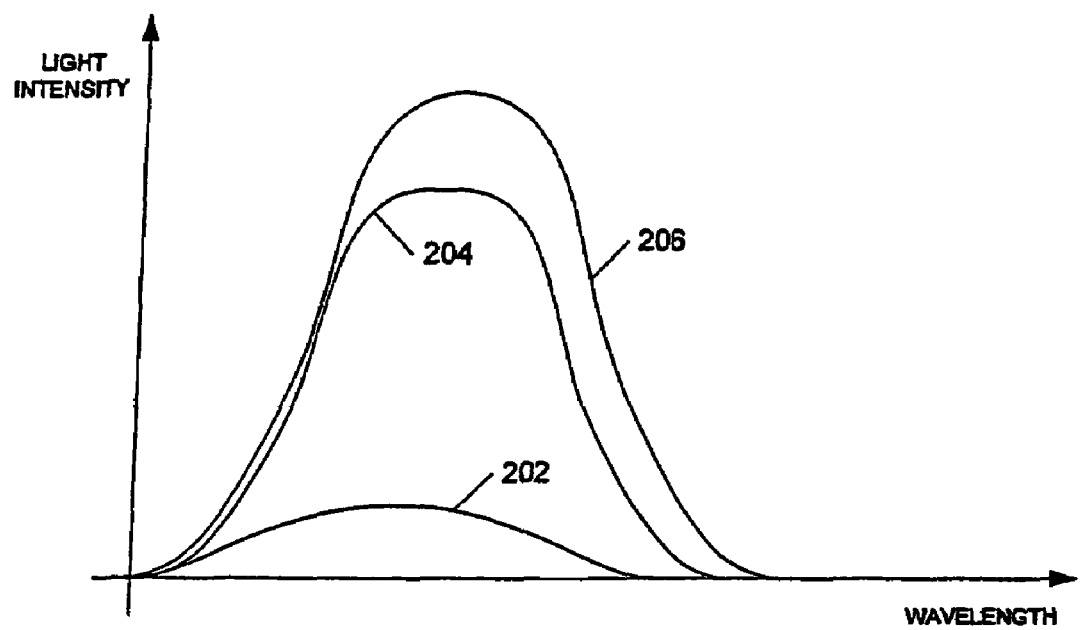
FIGS. 2a and 2b show spectra of photoluminescent materials illustrating photoluminescence quenching.
Figure 2B:
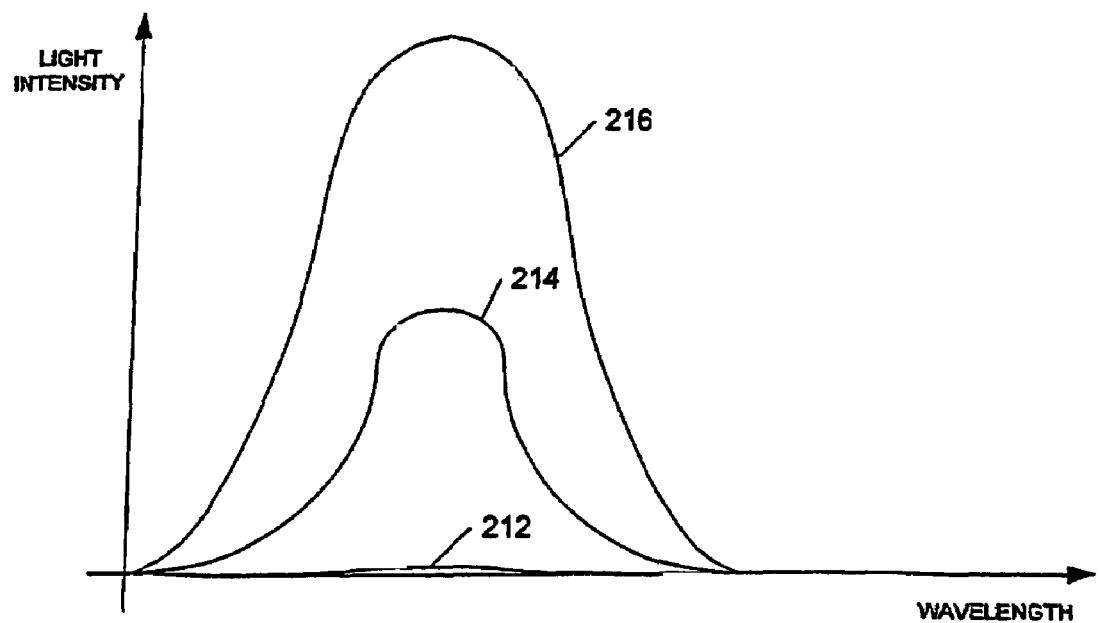

Referring now to FIG. 2, this shows exemplary spectra of two different types of photoluminescent material in FIGS. 2a and 2b. The spectrum of FIG. 2a is typical of materials which although having a relatively high photoluminescence efficiency also have a strong intrinsic colour. An example of such a material is the polymer blend F8BT-TFB, which has a photoluminescence efficiency of greater than 80%, photoluminescing yellow under white light, but also having an intrinsic yellowish colour, so that the material looks yellow even when the photoluminescence is quenched. This residual or intrinsic colour arises because the material intrinsically absorbs a set of wavelengths which gives it a yellow appearance. This yellow colour is also apparent when the material is deposited as a thin film as the material's absorption is still a significant factor.

FIG. 2a shows three spectra 200 illustrating the variation of light intensity with wavelength for a material such as F8BT-TFB with an intrinsic colour. Spectrum 204 represents the photo-emission spectrum of the material in a device such as that shown in FIG. 1a or 1b with zero applied bias. With forward bias the spectrum shifts to spectrum 206, with an enhanced electroluminescent emission and a peak which is shifted towards longer (redder) wavelengths. When reverse bias is applied to a device containing a material the spectrum shifts to spectrum 202, showing that the photoluminescent light emission is reduced in intensity and that the peak wavelength is shifted towards the blue.

FIG. 2b, by contrast, shows a set of spectra 210 for a device containing a photoluminescent material with no intrinsic colour. Spectrum 214 represents the device with no applied bias, spectrum 216 the spectrum with forward bias applied with emission enhanced by electroluminescence, and spectrum 212 the spectrum with reverse bias applied to substantially quench the photoluminescence. As can be seen from FIG. 2b the position of the peak of spectra 212, 214 and 216 remains substantially constant as substantially the only contribution to the device's colour arises from the emitted photo/electroluminescence and not, as in FIG. 2a, from any contribution from the photoluminescent layer's intrinsic colour.

It will be appreciated that in FIGS. 2a and 2b the y-axis represents the intensity of light emitted from a device such as shown in FIG. 1a or 1b, and therefore includes two components. A first component is the photo or electroluminescent emission from layer 106 and a second component arises from reflection or scattering of the incident illumination at layer 106. Thus in a device where, for example, the cathode is absorbing or transparent and relatively little light is scattered from the photoluminescent layer itself, the spectra of FIG. 2a may approach those of FIG. 2b. Nonetheless it is preferable for some applications to use a material which is intrinsically colourless rather than one which is intrinsically coloured as this simplifies device design.

When selecting suitable photoluminescent materials the main criteria is a high photoluminesence efficiency, which assists in providing a display with good contrast. The skilled person will appreciate that although photoluminescence efficiency and electroluminescence efficiency are related a high electroluminescence efficiency does not necessarily imply a high photoluminescence efficiency. Important secondary considerations in material selection are the material's inherent colour lifetime processability, and stability. Significant decay routes in electroluminescent materials include internal photo-degradation, excimer formation and electromigration. These are expected to be less significant for photoluminescent materials in a reverse biased device and it is therefore practical to employ photoluminescent materials in such a device which would be disregarded for use in an electroluminescent device because of their poor lifetimes under forward bias. Thus potentially a significantly broader range of materials is available to select from.

Red, green and blue intrinsically colourless photoluminescent polymers, as exemplified below, are available for use in photoluminescence quenching displays. This allows the production of colour displays as well as black and white displays in which white illumination is produced by a blend of red, green and blue emitting photoluminescent polymers. It will be appreciated that since the photoluminescence quenching display is an emissive display technology, albeit relying on quenching of an emission rather than electronic excitation of an emission, red, green and blue emissive materials are desirable to provide a broad colour gamut For some applications, however, a sufficiently broad colour locus may be provided using only two different colours of emission. The human eye's visual sensitivity varies with wavelength and depends not only on the peak position but also on, effectively, on a convolution of the integrated area under the peak with the eye's sensitivity. This means yellow emitters are generally perceived as brighter than, for example, blue emitters and this can also be taken into account when designing a colour display.

An example of an intrinsically colourless polymer with blue photoluminescence is a polymer in the polyfluorene class, such as PFB or TFB.

An example of an intrinsically colourless red photoluminescent polymer is a polymer in the perylene class such as are disclosed in WO01/42331. An intrinsically red-brown polymer with red photoluminescence may be obtained by doping F8BT with poly(2,7-(9,9-di-n-octylfluorene)-co-(2,5-thienylene-3,6-benzothiadiazole-2,5-thienylene).

An example of an intrinsically colourless green photoluminescent polymer is a polyquinoxaline such as those disclosed in WO01/55927.

An intrinsically colourless polymer with white photoluminescence may be provided by blending the above intrinsically colourless polymers with red, green and blue photoluminescence in appropriate proportions.

Figure 3A:
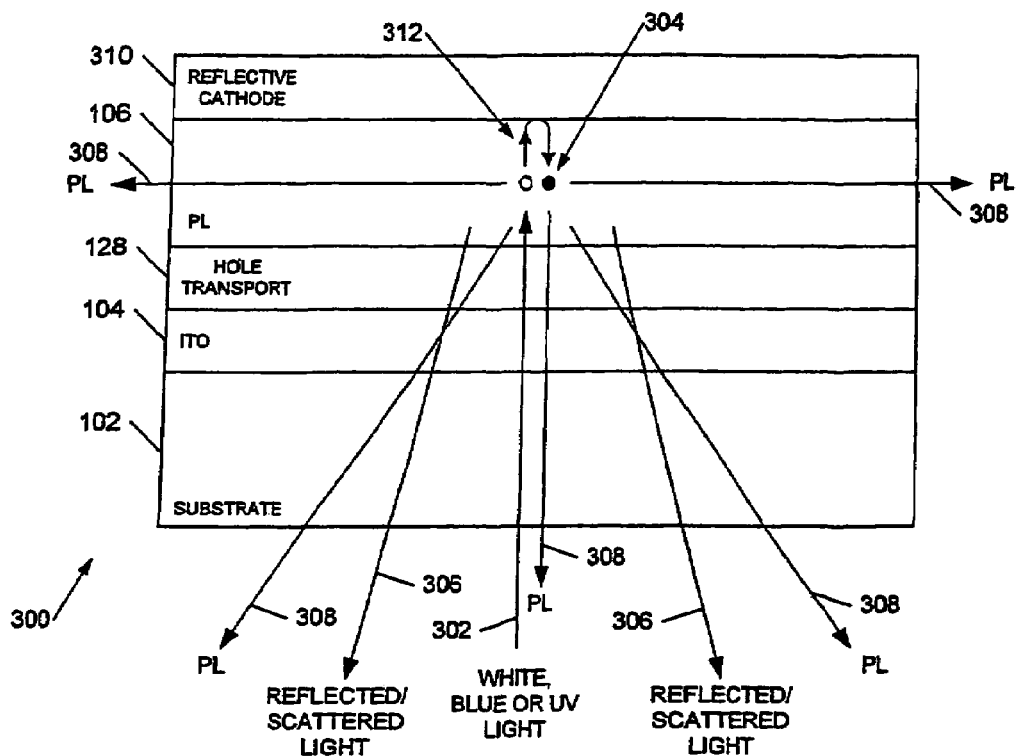
FIGS. 3a and 3b show, respectively, schematic illustrations of photoluminescence from reflective and transparent cathode devices.
Figure 3B:
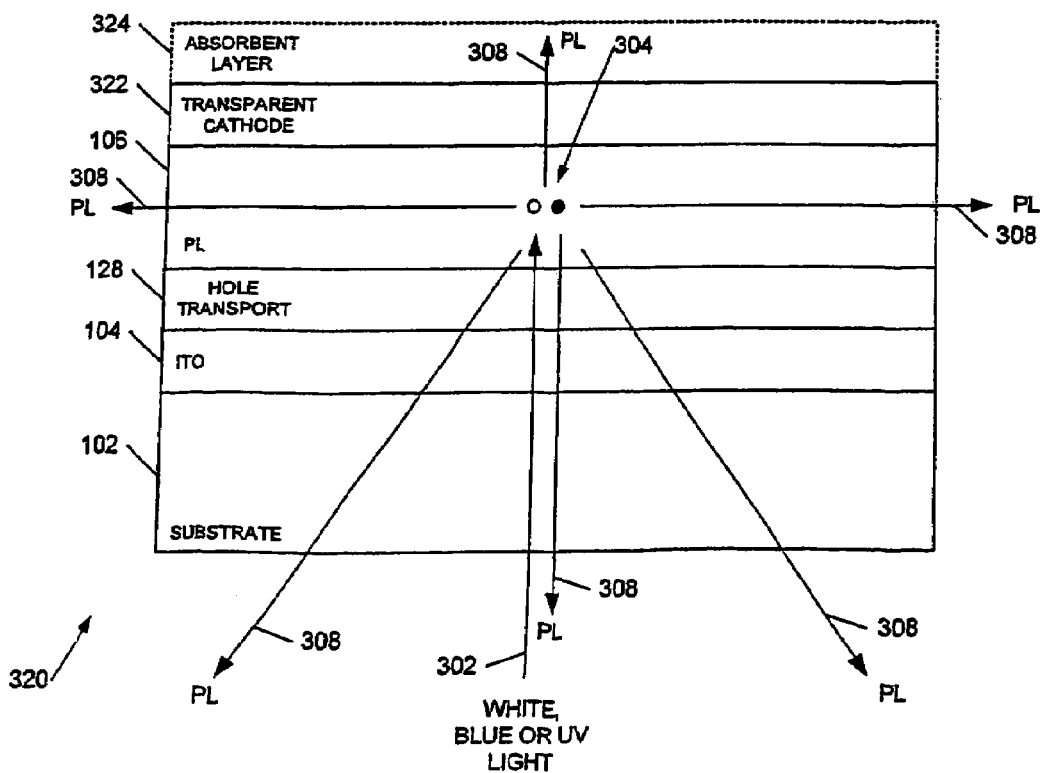

FIGS. 3a and 3b show, schematically, an enlarged portion of a cross-section through a device such as that illustrated in FIG. 1b; the photoluminescent layer 106 in particular is not to scale. FIG. 3a shows an embodiment comprising reflective a cathode layer 310 whilst in the embodiments of FIG. 3b a transparent cathode layer 322 is used, behind which is optionally located an additional light absorbent layer 324. In the simplified diagrams of FIGS. 3a and 3b contacts to the anode and cathode are not shown, but arrangements such as described with reference to FIG. 1 can be employed. Likewise cathodes 310 and 322 may comprise one or more layers as described with reference to FIG. 1b, although where the cathode layers comprise metal the cathode layer 310 should be thick enough to be relatively light-reflective (typically >250 nm) whilst the cathode layer 322 should be thin enough to be relatively light-transmissive in the visible region of the spectrum.

Referring now to FIG. 3*a* in particular, incident white, blue or UV illumination 302 from either a front or back light or ambient light passed through the substrate 102, transparent anode 104, and hole transport layer 128 to the layer of photoluminescent material 106. Here it is absorbed generating excitons, that is bound electron-hole pairs such as schematically illustrated exciton 304. In other configurations photoluminescent layer 106 may be illuminated through the cathode rather than through the anode.

With no applied field a significant fraction of these optically excited excitons rapidly radiatively decay producing light according to the photoluminescence spectra of the material or materials forming layer 106. This photoluminescence, schematically illustrated at 108 in FIG. 3*a*, is emitted substantially isotropically, and thus the display approximates to a lambertian emitter. The fraction of the excitons decaying radiatively depends upon the photoluminescence efficiency of the material and upon the applied field. When the diode formed by the device is in an off state—typically, but not necessarily, when the anode and the cathode are at the same electrical potential—the display is in a quiescent photo-emitting or on state.

In the arrangement of FIG. 3*a* the cathode layer 310 reflects both a portion of the photoluminescence 308 and a portion of the incident illumination 302. Another portion of incident illumination 302 is reflected or scattered directly by photoluminescent layer 106. Thus when the display is viewed an observer sees a combination of the emitted photoluminescence 308 and a reflected and/or scattered component 306 of the incident illumination 302. This scattered light tends to reduce the display contrast but can be substantially reduced by side illumination as described later.

In FIG. 3*b* cathode layer 322 is transparent and thus the reflected/scattered light component is much smaller or absent, although photoluminescence emitted towards the rear of the device is effectively lost. When the display is off (not photoluminescing) a viewer sees through the transparent cathode 322 to what is behind. Thus an absorbent or optically black layer 324 may be optionally provided behind transparent cathode 322 or, in other embodiments, cathode 322 may itself be black. With the arrangement of FIG. 3*b* back illumination of photoluminescent layer 106 is also possible but in this case, depending upon the photoluminescence efficiency and upon the wavelength of the back-light, a viewer will generally see the back-light illumination together with the photoluminescence, which again can reduce the effective contrast.

When the diode formed by the anode, cathode and photoluminescent layer 106 is reverse biased, that is when the anode is held at a lower electrical potential than the cathode, a fraction of the excitons are split into their constituent holes and electrons and these are then conducted out of the structure with the aid of the applied electric field. Thus this fraction of the excitons is prevented from radiatively decaying and hence emitting photoluminescence. The fraction of the excitons split apart in this way is determined by the reverse voltage applied to the device, and thus the level of photoluminescence can be controlled from a maximum value with no applied voltage to a reduced value depending upon the degree of reverse bias.

It will be appreciated that the power consumption of the device is very low because, essentially, the only power required is that to conduct away the holes and electrons of the split excitons. This will vary depending upon the degree of incident illumination and upon the photoluminescence efficiency. It will also be appreciated that since a larger reverse bias is needed for a dimmer display, the power consumption is to some degree dependent upon the degree of contrast required. It will further be appreciated that because the primary source of energy for the display is provided by the incident illumination, the display will operate better in high ambient light conditions such as bright sunlight, conditions which conventional displays typically find hard to cope with. Where a material which is both a good photoluminescer and a good electroluminescer is selected a dual mode device is possible in which, under bright conditions the display operates in a photoluminescence quenching mode and in which under less bright conditions or conditions of no ambient illumination the device is forward biased to electroluminesce. One example of a material which has both a high photoluminescence efficiency and a high electroluminesence efficiency is F8BT-TFB, and a dual mode device may be constructed using this material.

Figure 4A:
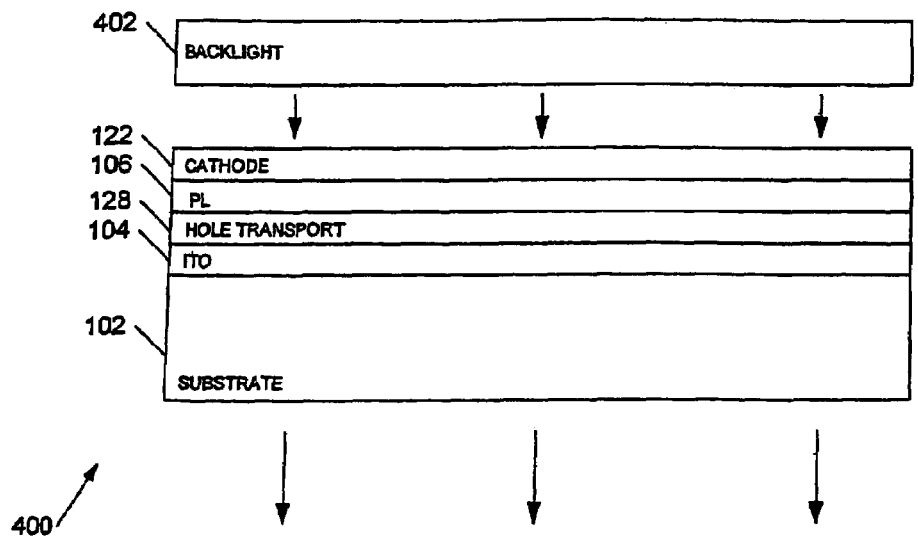
FIGS. 4a and 4b show illumination arrangements for photoluminescence quenching devices and FIG. 4c shows an optical micro structure for a photoluminescence quenching device.

Referring now to FIG. 4, this shows exemplary illumination schemes for photoluminescent quenching devices as described above. In FIG. 4*a* a display device 400 comprises a photoluminescent quenching display 102, 104, 106, 122, 128 with a back light 402. The back-light may comprise, for example, any conventional LCD back-light. The device anode layer 104 comprises transparent indium tin oxide and cathode 122 a thin layer of metal, such as a 50 nm layer of calcium.

When back-light 402 is on and no reverse bias is applied to the display device the display colour is a combination of the photoluminescence colour and the intrinsic colour of photoluminesent layer 106. Thus where, for example; layer 106 is intrinsically colourless and photoluminesces in blue, with a white back-light the display will appear blue-white with no bias and white with reverse bias. The same display under white ambient light illumination would appear blue with no bias and colourless (or would have the colour of the cathode) with reverse bias.

It is possible to select the material of the photoluminescent layer 106 in the device of FIG. 4*a* so that the intensity of the colour changes with the applied bias without a substantial colour shift. This can be done by selecting a material in which the photoluminescence colour approximates to the intrinsic colour of the material, that is by using a material with a set of spectra which is closer to that of FIG. 2*a* than that of FIG. 2*b*. One example of such a material is the yellow emitter F8BT-TFB. With such a configuration it is then possible to use the back-light 402 to compensate for a lack of ambient illumination without any significant change in the display appearance, increasing the back illumination as the ambient illumination from the front falls.

Figure 4B:
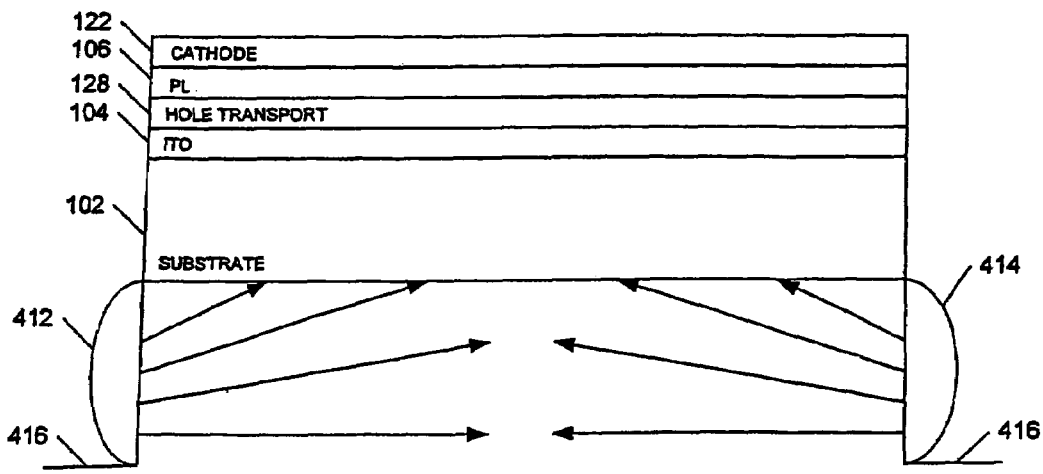

The arrangement of FIG. 4*b* shows one way in which the display can be artificially illuminated from the front, using a baffle 416 and cylindrical lenses 412 and 414 to direct light from light sources (not shown) to either side of the display on to the front of the display surface. Preferably this illumination is arranged, as illustrated, to shine across the front of the display and into the display, rather than out towards a viewer of the display. This arrangement is best suited to photoluminescent materials with spectra as illustrated in FIG. 2*b*, that is to intrinsically colourless materials. The cathode layer 122 in the device of FIG. 4*b* may be either reflective or transmissive as explained with reference to FIG. 3.

For many applications, the arrangement of FIG. 4*b* is preferable to that of FIG. 4*a* since a front-lit device with a reflective cathode will generally make better use of the luminescence than a back-lit device. Furthermore, in the arrangement of FIG. 4b, the photoluminescence material does not need to be colourless allowing selection from a broader range of materials which, as a category, will tend to have a higher photoluminescence efficiency than colourless materials as they can absorb a greater fraction of the available illumination.

Figure 4C:
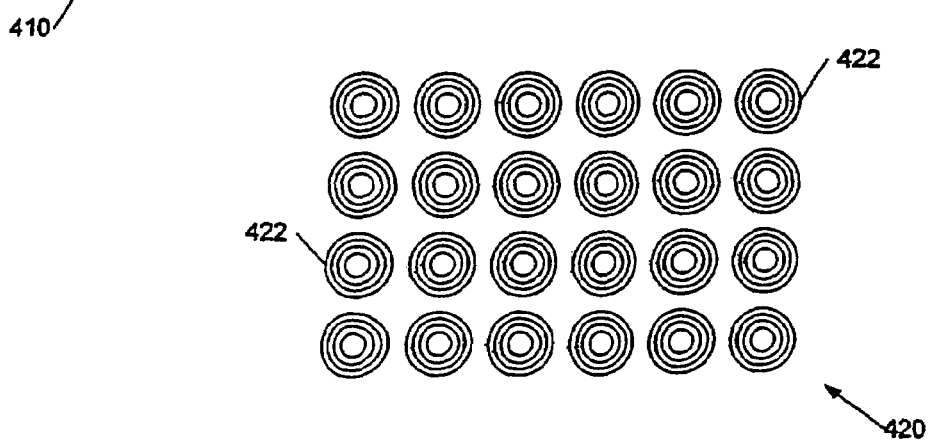

FIG. 4c shows an optical structure for 20 which may be formed on the front face of substrate 102 to improve the absorption of ambient light and to direct emitted light towards an observer of the display. In a preferred embodiment this optical structure comprises a microlens array, that is a regular arrangement of small lenses 422. Such an array can be formed by a range of conventional techniques including lithography and/or replication on substrates such as silicon, glass, and plastic. Lens sizes typically range from 20 μm to around 1 mm in diameter with focal ratios from f1 to f4. The UK National Physical Laboratory manufactures such arrays to customer specifications. Other optical structures which may be used to enhance the display's appearance include "motheye" antireflection structures.

Figure 5A:
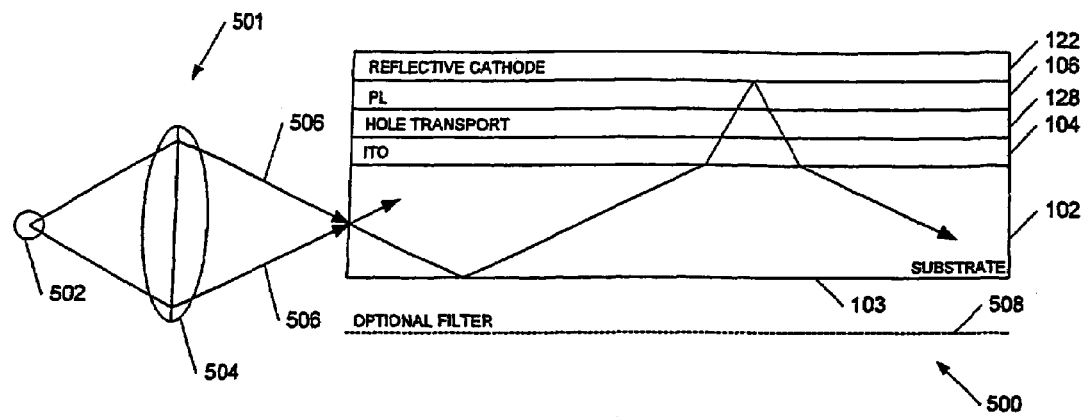
FIGS. 5a to 5c show, respectively, cross-section and plan views of a lighting arrangement for waveguiding illumination of a photoluminescence quenching device, and details of waveguiding within a photoluminescence layer.

FIG. 5 illustrates one particularly advantageous illumination method, in which light is waveguided within the substrate 102. In this way the illumination can be substantially confined within the display device so that substantially the only light emitted by the display arises from photoluminescence, thus increasing the potential contrast FIG. 5a shows a cross section through a photoluminescence quenching device 500 with illumination means 501 positioned to one side of the device.

Figure 5B:
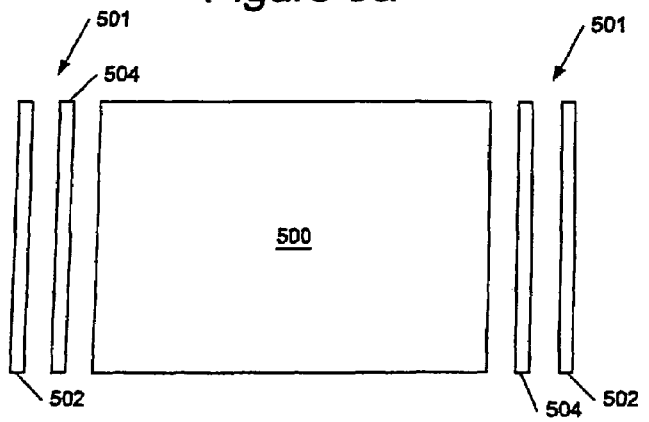

FIG. 5b shows a plan view of a photoluminescence quenching device 500 with illumination means 501 on two opposite sides of the device. The illumination means 501 comprises a longitudinal illumination source 502 and a cylindrical lens 504 which collects light from light source 502 and directs this into the substrate 102 in such a way that the light is waveguided within the substrate. Other conventional means of coupling light into a waveguided mode of the substrate, such as a prism or grating, may also be employed.

As can be seen in FIG. 5a light propagating within the substrate is waveguided by total internal reflection from a front surface 103 of the substrate and by reflection at reflective cathode 122. It will be appreciated that the illumination could also be waveguided by reflection at other surfaces. For example, the front surface 103 of the substrate could be provided with a layer which reflects the illumination but not the photoluminescence. Were the device structure to be inverted on the substrate, a reflective anode could be used instead of a reflective cathode. Whatever arrangement is chosen for the illumination, however, energy must always be coupled from the illumination source 502 into the photoluminescence layer 106.

Total internal reflection at substrate front surface 103 is achieved when the angle θ between a ray 506 and the normal to the surface is $\sin \theta = n_2/n_1$, where $n_1$ is the refractive index of the substrate and $n_2$ is the refractive index of air. For angles of incidence greater than θ the light is totally internally reflected and hence substantially confined within the device. The launch optics (in this case the cylindrical lens) are designed to ensure the illumination is directed only into waveguiding modes of the substrate and is thereby not visible to the observer.

Figure 5C:
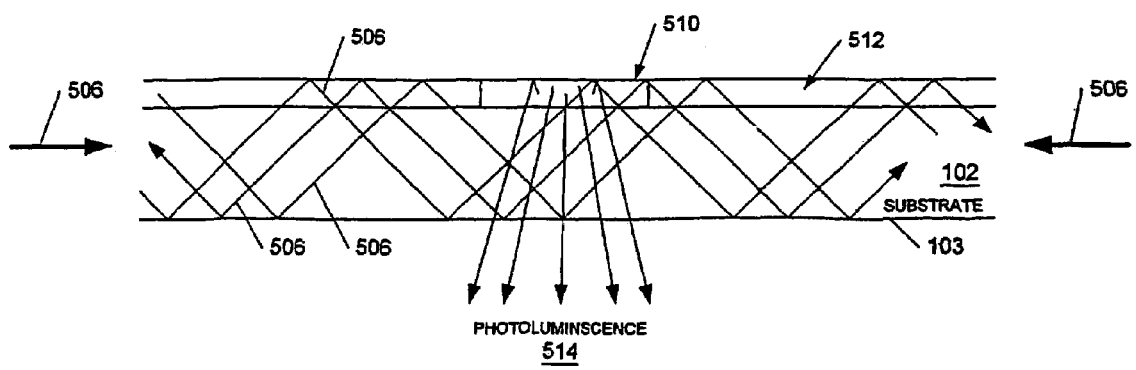

FIG. 5c shows an enlargement of the photoluminescence quenching device 500 in which layers 122, 106, 128 and 104 are collectively shown as layer 512, which is reflective at its back surface. FIG. 5c also schematically illustrates a single pixel 510 of the photoluminescence quenching display 500. When no bias is applied to this pixel photoluminescence is emitted from the pixel as shown (for the purposes of illustration photoluminescence from other parts of layer 106 is assumed to be quenched). The illuminating light is substantially confined within the substrate so that all an observer sees is the photoluminescence 514 from the pixel; when a reverse bias is applied to the pixel this photoluminescence is switched off.

Where, as illustrated in FIG. 5a, cathode 122 is reflective more photoluminescence is directed out of the front surface of the display when the pixel is on (because light emitted in the reverse direction is reflected towards the front surface), although a shiny cathode, or the intrinsic colour of the photoluminescent material will be visible when the pixel is off or reverse biased, (depending upon whether or not the photoluminescent material is intrinsically coloured). Where a matt black cathode or a transparent cathode and absorbing layer is employed in the device an observer will either see photoluminescence or a black pixel. An optional filter 508 may be provided in front of the display to filter out shorter wavelength components of any ambient light to reduce the contribution of any intrinsic colour the photoluminescent material may have where the cathode is reflective.

In the arrangement of FIG. 5 non-illuminated edges of the photoluminescent layer 106 may be made reflective to increase the number of passes the light 506 makes through the substrate. Where absorption in the photoluminescent material is strong and/or photoluminescent efficiency is higher or the display area large, light sources may be provided on more than one side or on all sides of the display 500. Although it is theoretically possible to waveguide the illuminating light within only the active device layers (and not the substrate) strong absorption of the illumination makes this impractical.

Figure 6A:
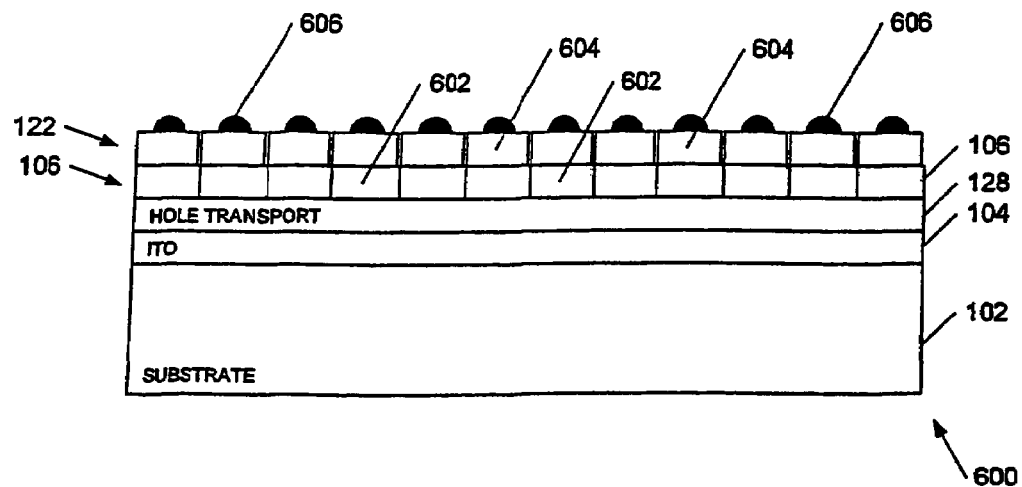
FIGS. 6a to 6d show, respectively, a pixellated photoluminescence quenching display, a pixellated colour photoluminescence quenching display and display driver, a pulse-width modulated waveform for driving a photoluminescence quenching display, and an active matrix pixel driver circuit.

FIG. 6a shows an example of a pixellated display structure 600. This broadly corresponds to the above described display structures except that the photoluminescent layer 106 is pixellated, that is it is divided into a plurality of separate display elements 602. Likewise the cathode layer or layers 122 is divided into a plurality of separate cathodes 604 each with its own contact 606. The substrate 102, anode 104, and hole transport layer 128 are, however, common to all the pixels. Thus an individual pixel may be switched off by applying a reverse bias between the common anode 104 and the appropriate cathode connection 606. In other pixelated displays X-Y pixel addressing may be employed using row and column electrodes.

In the arrangement of FIG. 6a the individual photoluminescent display elements 602 may either have all the same colour, or may have different colours to provide a colour display. Alternatively a colour display may be provided by using a white-emitting polymer blend for the photoluminescent material for elements 602 and then appropriately filtering the display elements to provide red, green, and blue pixels. Conventional filters such as are used for LCD displays can be employed for this purpose, or additional filtering layers may be included within the structure of the pixellated device 600. Suitable filtering materials are described in WO98/59529 and the materials mentioned therein which function as filters are hereby incorporated by specific reference. As a further alternative a combination of white and coloured photoluminescent pixels may be employed, the coloured pixels being used to directly produce a desired colour, and the white pixels being filtered to provide other colours. For example blue pixels may be provided using blue photoluminescent material and red and green pixels may be provided by filtering white photoluminescent emission.

Still further examples of device structures which may be driven in reverse to provide multicolour photoluminesent displays are provided in WO95/06400 (FIG. 1 and the accompanying description) and WO98/59529 (FIG. 1 and the accompanying description, and the statement of invention) and these are included in the present application by reference to the specifically mentioned parts of these documents.

Figure 6B:
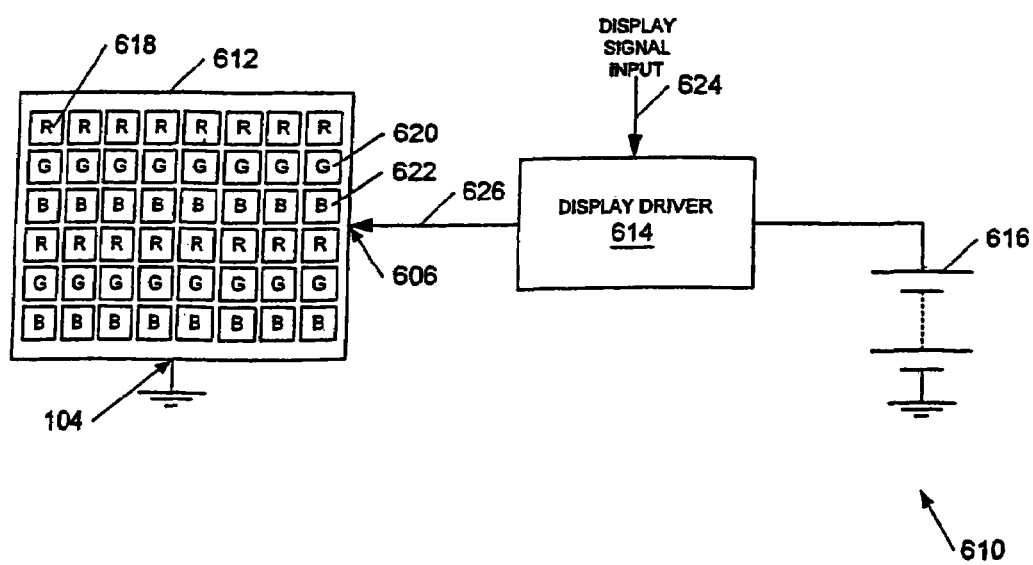

FIG. 6*b* shows display equipment 610 including a colour pixellated display 612, display driver circuitry 614 and a power source illustratively shown by battery 616. The display 612 comprises a plurality of red 618, green 620, and blue 622 pixels arranged in a pattern which, from a distance, is capable of providing the appearance of a variable colour display. A variety of pixel patterns are possible in addition to the one shown to help reduce visual artefacts. For example a repeated pattern of four pixels, red, green, green and blue may be employed.

Display driver 614 receives a display signal input 624 and provides an output 626 to drive electrodes 104 and 604 of FIG. 6*a*. As illustrated in FIG. 6*b* the common anode connection 104 and the negative terminal of the power source, battery 616, are both connected to ground. The display driver applies a positive voltage from power source 616 to a selected cathode connection 606 in accordance with the display signal input on line 624. The display signal may comprise a single pixel on/off signal or may comprise an analogue or digital pixel brightness signal indicating a desired level of pixel brightness between the on and off states. In a colour display such as is illustrated in FIG. 6*b* separate signals are preferably provided for each red, green and blue pixel, to give the appearance of variable colour pixels.

When the display signal indicates that a pixel is to be on display driver 614 either leaves the appropriate pixel unbiased (zero bias), or applies a forward bias, or applies a reverse bias to provide a degree of photoluminesence quenching to control the pixel to a predetermined maximum brightness. When the display signal indicates that a pixel is to be off the display driver applies a reverse bias to the pixel to partially or completely quench the photoluminescence from the pixel, for example to bring the pixel brightness down a predetermined off brightness level. When the display signal indicates a desired pixel brightness between maximum and minimum brightness the display circuitry 614 applies an appropriate level of reverse bias to the selected pixel for the desired pixel brightness.

The display driver 641 may also incorporate means to provide an adjustable duty cycle pulse-width modulated drive signal to each pixel responsive to the display signal input on line 624. The pulse modulated driving signal may have a zero or forward bias first voltage level and a reverse bias second voltage level and a frequency of 60 Hz or greater. By selecting, for example, one of a plurality of mark-space ratios provided by a pulse generator the brightness level of a pixel may be controlled and, in a colour display, the colour and luminescence or brightness of a pixel may be controlled.

Figure 6C:
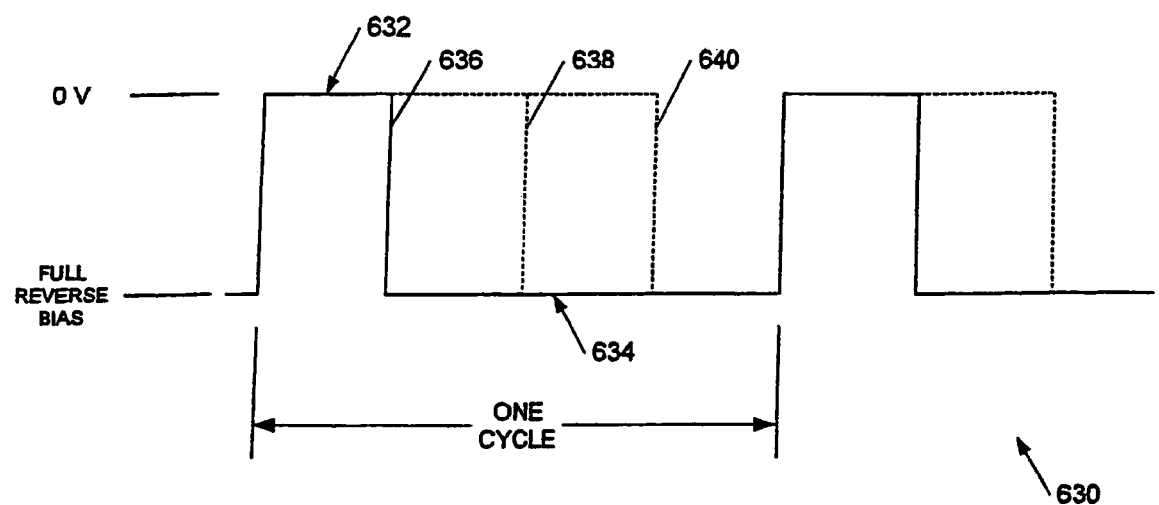

Referring now to FIG. 6*c*, this shows an exemplary pulse-width modulated (PMW) waveform 630 for use in controlling pixel brightness. The waveform shows the voltage applied to a pixel against time, the voltage varying between a first level 632, in the illustrated example zero volts, and a second level 634, which in the illustrated example corresponds to full reverse bias applied to the pixel. The portion of the waveform at voltage level 632 is referred as the "mark" and the portion of the waveform at level 634 as the "space". During the mark portion of the waveform, the pixel photoluminescences and during the space portion of the waveform, the photoluminescence is substantially quenched.

The frequency of waveform 630 is chosen so that rather than a pixel appearing to flash on and off, emission from the pixel appears substantially continuous, but with a brightness proportional to the on or mark period of the waveform. To achieve this, a frequency of at least 25 Hz to 50 Hz is generally required. It can be seen from FIG. 6*c* that when the mark-to-space transition 636 is as shown, the pixel appears at approximately 25% of its full brightness. Transition positions 638 and 640 correspond, respectively, to pixel brightnesses of 50% and 75% and 100% brightness corresponds to a steady state zero volts (in the example) with a 100% mark:space ratio duty cycle. Waveforms other than that shown in FIG. 6*c* may also be used and, for example, the driving waveform need not have square edges.

Using pulse width modulation has the advantage that there is a substantially linear relationship between the duty cycle and the apparent-pixel brightness. Were the pixel brightness to be varied by varying the reverse bias voltage the characteristics of individual pixels would need to be relatively closely matched and some form of linearisation, such as a look-up table, might also be necessary. An additional or alternative form of brightness control comprises sub-dividing each pixel into n sub-pixels with area ratios in powers of 2 ($2^0$, $2^1$, $2^2$ etc), thus providing $2^n$ different brightness levels depending upon which sub-pixels are selected to be on.

In principle, every pixel in the display may have a different brightness to the other pixels and thus the display driver 614 of FIG. 6*b* should be capable of driving each pixel with a pulse width modulated waveform appropriate for its selected brightness. One way of achieving this is to provide a separate, variable pulse-width pulse generator for each pixel or for each row or column of pixels in the display. Suitable integrated circuits to accomplish this are available from the Clare Micronix subsidiary of Clare, Inc, California, USA and include the MXED101, MXED102, and MXED202. For example, the MXED102 is a 240 channel cascadable column driver providing 240 independently adjustable pulse width modulated outputs. Data sheets for these devices are available on the Clare Micronix website and are hereby incorporated by reference.

The photoluminescence quenching effect switches on and off very quickly, which is generally advantageous, but which also makes the use of a passive matrix scanning-type display more difficult. In a passive matrix display one of the electrodes is patterned in rows and the other in columns and each pixel is addressed by applying an appropriate voltage between the row and column electrodes at whose intersection it lies. In an LCD display the relatively slow response means that by the time the pixel is next activated, the state of the pixel is substantially unchanged. However, in a photoluminescence quenching display such a scanned arrangement results in a reverse bias only being applied for a small fraction of the total time, thus reducing contrast. For this reason, it is preferable to use an active matrix-type display. In an active-matrix display, circuitry is provided so that each pixel can be left in either an emitting or a non-emitting state whilst another pixel is addressed.

Figure 6D:
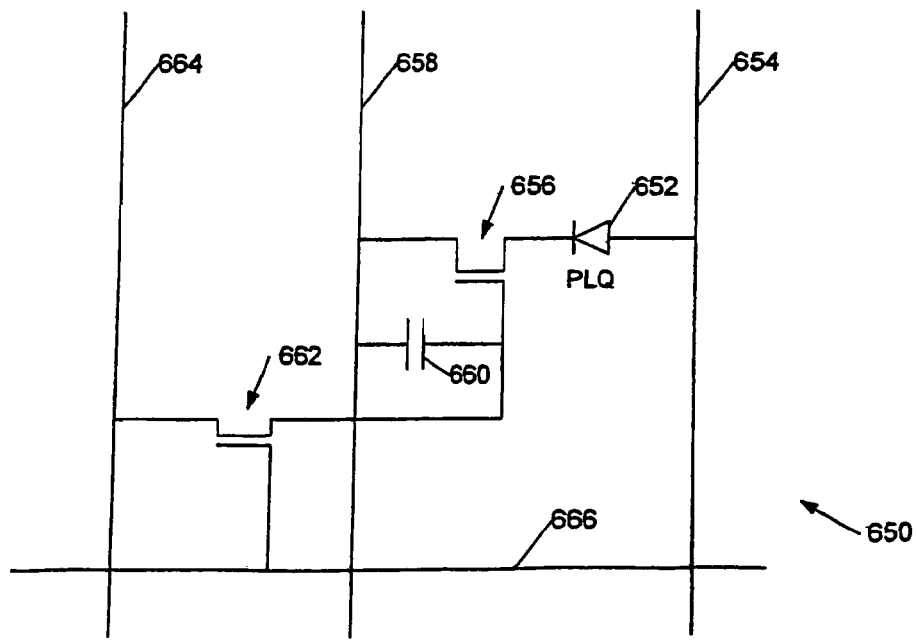

An exemplary active matrix pixel driver circuit 650 is shown in FIG. 6*d*. A photoluminescence quenching display pixel is schematically illustrated by a diode 652 connected between a zero volt bus 651 and a switching transistor 656, in turn connected to a positive voltage supply bus 658. When switching transistor 656 is on, diode 652 is reversed biassed by the voltage between busses 654 and 658. A storage capacitor 660 stores charge to hold switching transistor 656 in a selected state, in a preferred embodiment either fully on or fully off. Charge is stored on capacitor 660 by means of a second transistor 662 connected to a row (or column) signal line 664 and to a column (or row) scan line 666. When a voltage is applied to the scan line to switch transistor 662 on, the voltage on signal line 664 is applied to storage capacitor 660, which retains its charge state when transistor 662 is afterwards switched off.

The substrate 102 of the photoluminescence quenching device may comprise, for example, either glass or plastic and the pixel driver circuit 650 may be constructed using either amorphous silicon or organic conductors, capacitors, and transistors. The active matrix electronics, when integrated with the display pixels, may be located behind the reflective cathode or between the photoluminescence layer 106 and the substrate 102, in which case the photoluminescence quenching structure rather than the substrate is at the front (towards an observer) of the display.

The photoluminescence quenching pixel draws virtually no current when it is reversed biased which facilitates the use of organic thin film transistors. Organic devices offer the additional advantages of materials compatibility, ease of fabrication, flexibility and the like also provided by the photoluminescence quenching display elements. The fabrication of suitable devices is described in papers from the SID 2001 Symposium in San Jose, Calif. of June 2001, 'AMLCD Using Organic Thin-Film Transistors on Polyester Substrates', M. G. Kane, I. G. Hill, J. Campi, M. S. Hammond, B. Greening (all of Sarnoff Corp), C. D. Sheraw, J. A. Nichols, D. J. Gundlach, J. R. Huang, C. C. Kuo, L. Jia, T. N. Jackson (Penn State Univ), J. L. West, J. Francl (Kent State Univ), SID Symposium Digest, Vol. 32 pp 57-59, and in 'All-Polymer Thin Film Transistors Fabricated by High-Resolution Ink-Jet Printing' T. Kawase, (Univ of Cambridge and Seiko-Epson Corp.), H. Sirringhaus, R. H. Friend (Univ. of Cambridge), T. Shimoda (Seiko-Epson Corp.), SID Symposium Digest, Vol. 32, pp 40-43. Both these papers are hereby incorporated by reference.

Further details of pixel driving arrangements which may be adapted to a photoluminescence quenching display are described in WO 99/42983 assigned to the present applicant, and also in U.S. Pat. Nos. 5,828,429, 5,903,246, and 5,684, 365, all of which are hereby incorporated by reference.

Figure 7:
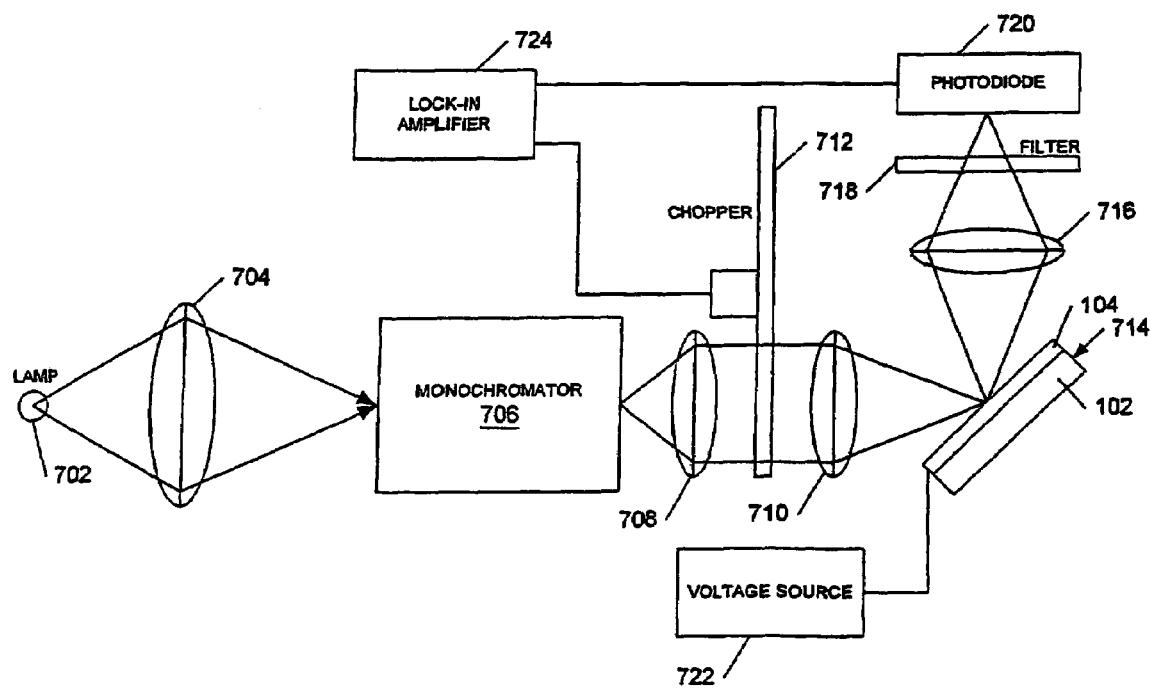
FIG. 7 shows experimental apparatus for characterising photoluminescence quenching.

Referring now to FIG. 7, this shows experimental apparatus 700 for measuring the intensity of photoluminescence emitted by a photoluminescence quenching display device as reverse bias is applied.

A xenon lamp 702 is coupled by a lens 704 to a monochromator 706, to allow the selection of a narrow range of illuminating wavelengths. The output from monochromator 706 is then focussed via a pair of lenses 708, 710 onto the display device-under-test 714. The lenses 708, 710 allow the monochromator output to be modulated by a mechanical chopper wheel 712 driven a lock-in amplifier 724. Photoluminescence from device-under-test 714 excited by the illumination from monochromator 706 is collected by lens 716 and directed onto a photodiode 720 also coupled to lock-in amplifier 724. The collected light is filtered by a low-pass filter 718 which rejects scattered light from monochromator 706 whilst allowing the photoluminescence to pass. A voltage source 722 is used to provide a variable reverse bias voltage to device under test 714. The lock-in amplifier 724 provides an output indicating the level of photoluminescence from device 714.

EXAMPLES

The results from two exemplary devices will be presented. The is comprised an 80:20 polymer blend of F8BT:TFB with a two layer calcium/aluminium cathode. The second comprised a 79:20:1 polymer blend of F8BT:TFB:poly(2,7-(9,9-di-n-octylfluorene)-co-(2,5-thienylene-3,6-benzothiadiazole-2,5-thienylene) with a three layer cathode of lithium fluoride/calcium/aluminium. Both devices photoluminesced in the yellow and had an intrinsic yellow colouration.

Figure 8A:
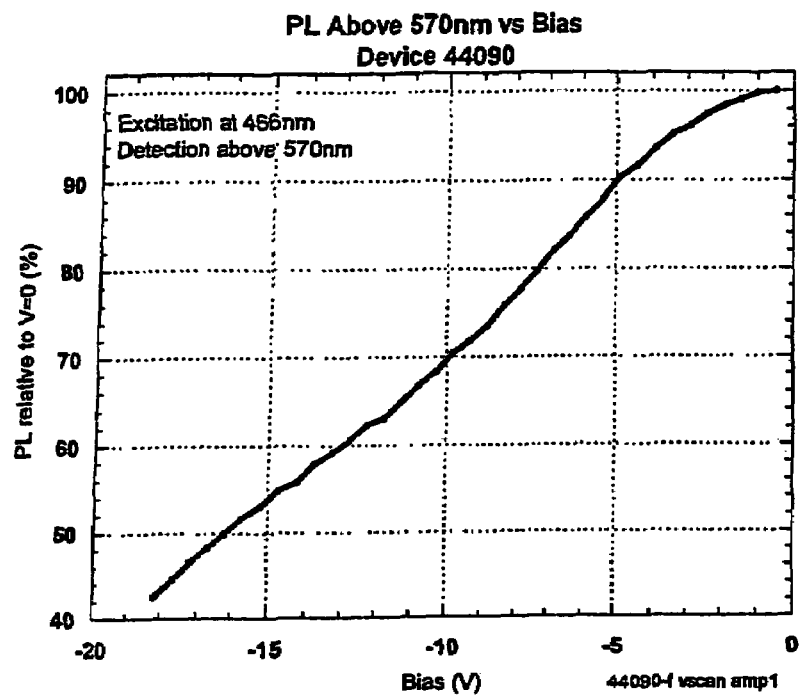
FIGS. 8a and 8b show photoluminescence quenching signals for two devices measured using the apparatus of FIG. 7.
Figure 8B:
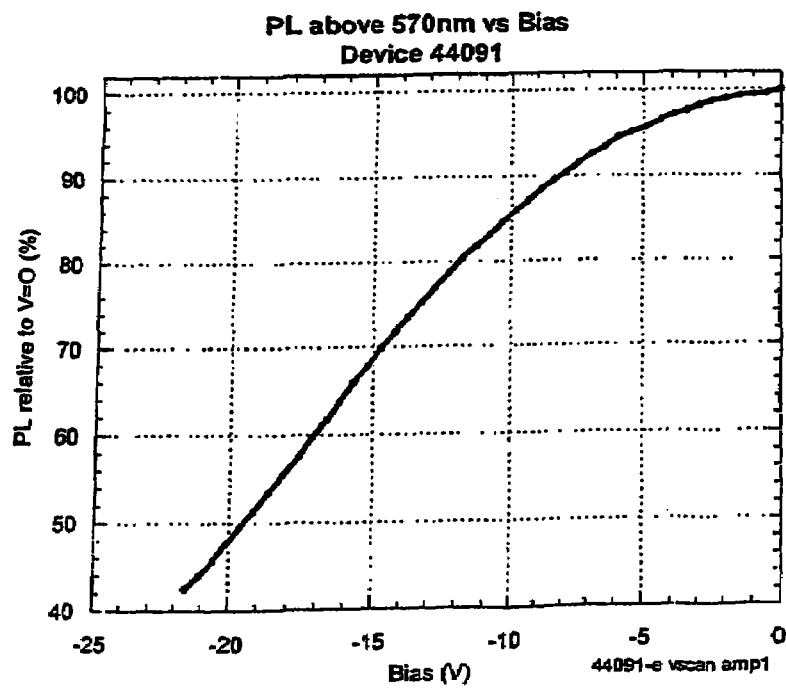

FIGS. 8*a* and 8*b* show the variation of photoluminescent emission with reverse bias for the first and second devices respectively. In each case the devices were excited using light having a wavelength of 466 mm, from monochromator 706, and filter 718 and photodiode 720 were arranged to collect light of a wavelength longer than 570 nm. The two graphs have been normalised to a maximum 100% photoluminescence level at zero applied bias.

The two graphs show that with a reverse bias voltage of around 20 volts the photoluminescence is reduced to approximately half its initial value. The photoluminesence was observed to return to its original intensity once the reverse bias voltage was removed.

Figure 9:
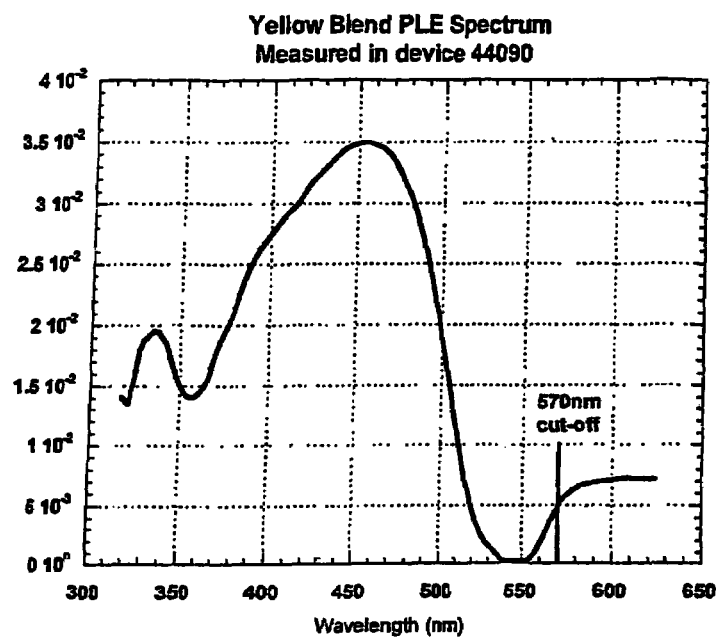

FIG. 9 shows the variation of photoluminescence intensity as a function of illuminating wavelength from monochromator 706 for the first device. The photoluminescence is cut off when the excitation wavelength is longer than around 570 nm; the residual tail on the graph of FIG. 9 results from scattered light from the excitation source. It can be seen that the maximum photoluminescence is observed when the excitation source has a wavelength of between 400 nm and 500 nm. This characterisation assists in selecting an appropriate illumination source. The threshold for photoluminescence in the device of FIG. 9, 570 nm, corresponds to the minimum photon energy which can still generate an exciton in the photoluminescent material. Thus in devices where it is desirable to prevent photoluminescence stimulated by ambient or background light a filter cutting off at wavelengths above 570 nm placed in front of the device will reduce ambient light-stimulated photoluminescence whilst still permitting photoluminescent emission at wavelengths longer than 570 nm to pass. This is helpful in devices of the type illustrated in FIG. 5*a*.

Figure 10:
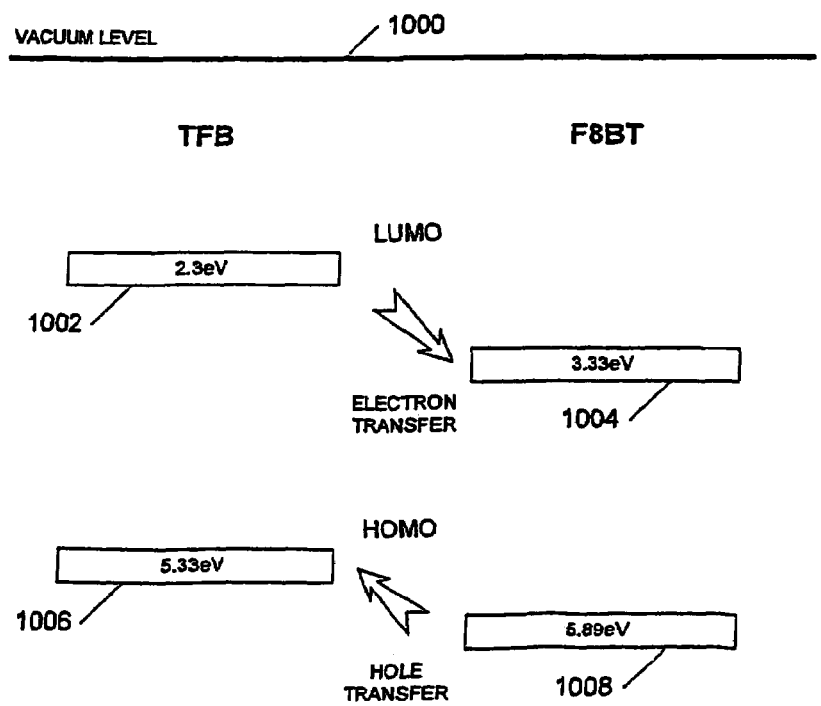
FIG. 10 shows a possible theoretical mechanism for photoluminescence quenching.

FIG. 10 illustrates a theoretical mechanism which is believed to be responsible for the photoluminescence quenching. Incident illumination causes a $\pi$-$\pi^*$ transition in one of the polymers, of the photoluminescent polymer blend, F8BT, generating an exciton, that is a bound hole-electron pair. This exciton may be dissociated by thermal energy greater than the exciton binding energy $E_b$. In an electric field the energy required to dissociate an exciton is reduced to approximately $E_b$–Xed where X is the electric field, e the charge on an electron and d the distance by which the hole and electron must be separated in order for the dissociation to be complete.

Referring again to FIG. 10, this shows the vacuum energy level 1000 and the lowest unoccupied molecular orbital (LUMO) energy levels 1002 and 1004 for TFB and F8BT respectively. FIG. 10 also shows the highest occupied molecular orbital (HOMO) energy levels 1006 and 1008 for TFB and F8BT respectively. In a simple picture, an exciton on F8BT will dissociate if the energy gained by a hole transferred to the HOMO of the TFB polymer (0.56 eV) exceeds the binding energy of the exciton on the F8BT polymer. Similarly an exciton formed on the TFB polymer will dissociate if the energy gained by transferring an electron to the LUMO of the F8BT polymer exceeds the binding energy of the exciton on the TFB polymer. It is believed that by applying a reverse bias electric field the energy needed to dissociate an exciton on the F8BT and on the TFB polymer is reduced and thus this hole/electron transfer process is activated—that is less energy is required for this transfer process and thus, at a given temperature, the process is more likely to occur. Dissociation must take place faster than radiative recombination. Measurements have determined that the estimated reduction in binding energy is consistent with the energy required to separate a hole-electron pair by a distance roughly equal to the separation between TFB and F8BT polymer chains.

No doubt many other effective alternatives would occur to the skilled person and it will be understood that the invention is not limited to the described embodiments and encompasses modifications apparent of those skilled in the art and within the spirit and scope of the claims appended hereto.

The invention claimed is:

1. A method of displaying information using photoluminescence quenching, the method comprising:
    providing an optoelectronic display comprising a photoluminescent material between a pair of electrodes;
    providing illumination for the photoluminescent material to cause the photoluminescent material to photoluminesce; and
    biasing the electrodes to at least partially quench said photoluminescence, the photoluminescent material having a normally-on, photoluminescence emissive state under zero bias across the electrodes.

2. A method of displaying information as claimed in claim 1 wherein said photoluminescent material comprises an organic photoluminescent material.

3. A method of displaying information as claimed in claim 2 wherein said organic photoluminescent material comprises a semiconducting conjugated organic polymer.

4. A method as claimed in claim 3 wherein said pair of electrodes comprises a cathode and an anode, said anode having a higher work function than said cathode, wherein said photoluminescent material is sandwiched between said pair of electrodes and wherein said biassing comprises reverse biassing to make said anode more negative than said cathode.

5. A method as claimed in claim 4 further comprising providing a hole transport material between said photoluminescent material and said anode.

6. A method as claimed in claim 2 wherein said photoluminescent material becomes substantially colorless when said photoluminescence is quenched.

7. A method as claimed in claim 2 wherein said photoluminescent material comprises a blend of materials having different photoluminescent colors.

8. A method as claimed in claim 7 wherein said blend of materials photoluminesces with a substantially white color.

9. A method as claimed in claim 1 wherein said optoelectronic display has a greater conductivity in a forward biassed direction of current flow between the electrodes than in a reverse biassed direction, and wherein said biassing comprises reverse biassing the electrodes.

10. A method as claimed claim 1 wherein at least one of said electrodes is at least partially transparent, and wherein said method further comprising displaying said photoluminescence material through said at least partially transparent electrode.

11. A method as claimed in claim 10 comprising providing said illumination through said at least partially transparent electrode.

12. A method as claimed in claim 10 wherein the optoelectronic display includes a light absorbing material on an opposite side of said photoluminescent material to said at least partially transparent electrode, the method further comprising at least partially absorbing in said light absorbing material a portion of said illumination transmitted through said photoluminescent material.

13. A method as claimed in claim 12 wherein said light absorbing material forms at least part of the other of said electrodes.

14. A method as claimed in claim 10 wherein both said electrodes are at least partially transparent, the method further comprising using a backlight for providing said illumination.

15. A method as claimed in claim 1 further comprising using ambient light for providing said illumination.

16. A method as claimed in claim 1 wherein the photoluminescent material of said optoelectronic display extends in two dimensions further than in a third dimension measured between said pair of electrodes, to provide a display area, the method further comprising illuminating said photoluminescent material using light propagating generally perpendicular to said display area.

17. A method as claimed in claim 1 wherein said optoelectronic display comprises a substrate mounting said photoluminescent material, the method further comprising illuminating said photoluminescent material by waveguiding light through said substrate.

18. A method as claimed in claim 17 wherein said photoluminescent material is sandwiched between the two electrodes, one of said electrodes is transmissive to said illumination and said photoluminescence, the other of said electrodes is reflective at least to said illumination, said optoelectronic display is configured for viewing through a front surface of said substrate, said photoluminescent material is mounted on a rear surface of said substrate, said transmissive electrode is located closer to said front surface than said reflective electrode, and wherein said waveguiding comprises waveguiding in a waveguiding region between the front surface of said substrate and said reflective electrode.

19. A method as claimed in claim 1, the method further comprising providing a plurality of photoluminescent display elements each having an associated pair of electrodes between which photoluminescent material is located, and biassing one or more of said pairs of electrodes to display information.

20. A method as claimed in claim 19 wherein said display elements comprise photoluminescent material photoluminescing with different colors for displaying information using two or more colors.

21. A method as claimed in claim 1 wherein said optoelectronic display comprises a pixellated display having pixels of at least two different colors positioned adjacent one another the pixels comprising at least two different respective photoluminescent materials photoluminescing at said different colors each pixel having associated electrodes, the method further comprising biassing the electrodes of said differently colored pixels to at least partially quench said differently colored photoluminescence to provide a multicolored, pixellated display.

22. A method as claimed in claim 1 wherein said photoluminescent material is also electroluminescent, the method further comprising biassing said electrodes with an opposite polarity to said biassing to at least partially quench said photoluminescence, to cause said photoluminescent material to electroluminesce.

23. A method as claimed in claim 1 further comprising providing said optoelectronic display with an optical structure to collect and deliver light to said photoluminescence material.

24. A method as claimed in claim 23 wherein said optical structure comprises a plurality of micro-lenses.

25. A method as claimed in claim 1, wherein said biassing comprises applying a voltage waveform to the electrodes, the method further comprising controlling a duty cycle of the waveform to adjust the quenching of said photoluminescence.

26. Method of displaying information on an optoelectronic display, the method comprising providing an optoelectronic display comprising a photoluminescent material between a pair of electrodes the method, comprising illuminating the photoluminescent material to stimulate photoluminescence and; applying a voltage to the electrodes to quench the photoluminescence to display information, the photoluminescent material having a normally-on, photoluminescence emissive state under zero bias across the electrodes.

27. Method as claimed in claim 26 wherein the display comprises a diode and the applied voltage reverse biasses the diode.

28. Method as claimed in claim 26 in ambient light, comprising using the ambient light alone to stimulate photoluminescence in the display.

29. Method as claimed in claim 26 wherein said optoelectronic display comprises dedicated illumination source to stimulate said photoluminescence.

30. Method as claimed in claim 26, further comprising using pulse width modulation of the applied voltage to control said photoluminescence.

31. Method of controlling a display driver of a light emitting display to display information, comprising: providing a light emitting display comprising a photoluminescent material between a pair of electrodes, applying a voltage of a first polarity from a display driver to the electrodes to reduce photoluminescence from the material to switch the light emission off and applying a reduced voltage at the first polarity, or substantially zero voltage, from the display driver to the electrodes to switch the light emission on, the photoluminescent material of the display having a normally-on, photoluminescence emissive state under zero bias across the electrodes.

32. A method of operating a photoluminescent device, the device comprising a semiconductor layer in the form of a film of organic photoluminescent material, a first electrode layer proximate a first surface of the semiconductor layer, a second electrode layer proximate a second surface of the semiconductor layer, the method comprising illuminating the device and applying an electric field between the first and second electrode layers across the semiconductor layer so as to render the second electrode layer negative relative to the first electrode layer to split optically excited excitons generated by the illumination into their constituent holes and electrons and to conduct said holes and electrons out of said photoluminescent film to inhibit photoluminescence from said film, the photoluminescent material of the display having a normally-on, photoluminescence emissive state under zero bias across the electrode layers.

33. A method as claimed in claim 32 wherein the film of organic photoluminescent material is coupled to said second electrode layer by a hole transport layer.

34. A method as claimed in claim 32 wherein at least one of said first and second electrode layers is at least partially transparent, for viewing said photoluminescent material.

35. A method as claimed in claim 34 wherein said device is illuminated through said at least partially transparent electrode layer.

36. A method as claimed in claim 35 comprising illuminating the device using ambient light.

37. A method as claimed in claim 34 comprising illuminating the device by guiding light within a region including said semiconductor layer.

38. A method as claimed in claim 37 wherein said semiconductor layer and said first and second electrode layers are mounted on a substrate, and wherein said region is bounded by a front surface of said substrate and the one of the first and second electrode layers farthest from said front surface of said substrate.

39. A method as claimed in claim 32 wherein said first electrode layer has a lower work function than said second electrode layer.

40. A method as claimed in claim 32 wherein said organic photoluminescent material comprises at least one conjugated polymer.

41. A method as claimed in claim 40 wherein said film of organic material comprises a thin, dense polymer film with a sufficiently low concentration of extrinsic charge carriers for the material to be suitable for an electroluminescent device.

42. A method as claimed in claim 40 wherein said photoluminescence material is selected to be substantially colorless when said photoluminescence is substantially completely inhibited.

43. An optoelectronic display device comprising:
a semiconductor layer in the form of a film of organic photoluminescent material, a first electrode layer proximate a first surface of the semiconductor layer, a second electrode layer proximate a second surface of the semiconductor layer; and
a light source to illuminate said photoluminescent material to stimulate photoluminescence from the material, the organic photoluminescent material of the display having a normally-on, photoluminescence emissive state under zero bias across the electrode layers.

44. An optoelectronic display as claimed in claim 43 wherein the film of organic photoluminescent material is connected to said second electrode layer via a hole transport layer.

45. An optoelectronic display as claimed in claim 43 wherein said organic photoluminescent material comprises at least one conjugated polymer.

46. An optoelectronic display as claimed in claim 45 wherein said film of organic material comprises a thin, dens polymer film and wherein the polymer film of the semiconductor layer has a sufficiently low concentration of extrinsic charge carriers that on applying an electric field between the first and second electrode layers across the semiconductor layer so as to render the second electrode layer positive relative to the first electrode layer charge carriers are injected into the semiconductor layer and radiation is emitted from the semiconductor layer.

47. An optoelectronic display as claimed in claim 45 wherein said photoluminescence material is selected to be substantially colorless when said photoluminescence is substantially completely inhibited.

48. An optoelectronic display as claimed in claim 43 wherein at least one of said first and second electrode layers is at least partially transparent, for viewing said photoluminescent material.

49. An optoelectronic display as claimed in claim 48 wherein said device is illuminated through said at least partially transparent electrode layer.

50. An optoelectronic display comprising:
a photoluminescent display device having a display on-state in which the display emits photoluminescence under optical illumination with no voltage applied to the device and a display off-state in which said photoluminescence is at least partially quenched; and
device driver circuitry having an input for receiving a display signal and an output for driving said display device, said display signal having an on-state indicating that the display is to be on and an off-state indicating that the display is to be off;

said photoluminescent display device comprising:
a semiconductor layer in the form of a film of organic photoluminescent material, a first electrode layer proximate a first surface of the semiconductor layer, and a second electrode layer proximate a second surface of the semiconductor layer; and wherein said device driver circuitry is configured to apply an electric field between the first and second electrode layers across the semiconductor layer so as to render the second electrode layer negative relative to the first electrode layer to split optically excited excitons generated by the illumination into their constituent holes and electrons and to conduct said holes and electrons out of said photoluminescent film to inhibit photoluminescence from said film in response to said display signal having said off-state; said display device and device driver combination primarily operating to display information by photoluminescence quenching, the organic photoluminescent material of the display having a normally-on, photoluminescence emissive state under zero bias across the electrode layers.

51. An optoelectronic display as claimed in claim 50 wherein said display photoluminescence is variable between said display on-state and said display off-state, wherein said display signal is variable between said display signal on-state and off-state, and wherein said device driver circuitry is configured to provide a variable waveform voltage output in accordance with said variable display signal to vary the average electric field between said first and second contact layers, to thereby vary said display photoluminescence.

52. An optoelectronic display as claimed in claim 50 wherein said device driver circuitry is further configured to reduce but not to reverse said electric field in response to said display signal having said on-state.

53. An optoelectronic display as claimed in claim 50 further comprising a light source to illuminate said photoluminescent material to stimulate photoluminescence from the material.

54. An optoelectronic display as claimed in claim 53 wherein both said first and second electrode layers are at least partially transparent, and wherein said light source is situated behind said film of photoluminescent material when the display is viewed from the front.

55. An optoelectronic display as claimed in claim 53 wherein said display device includes a region to channel illumination from said light source using internal reflection, to illuminate said photoluminescent material.

56. Optoelectronic device driver circuitry as recited in claim 50.

57. An optoelectronic display comprising:
a semiconductor layer in the form of a film of organic photoluminescent material, a first electrode layer proximate a first surface of the semiconductor layer, and a second electrode layer proximate a second surface of the semiconductor layer; and
a region to channel illumination from a light source using internal reflection, to illuminate said photoluminescent material, the organic photoluminescent material of the display having a normally-on, photoluminescence emissive state under zero bias across the electrode layers.

58. An optoelectronic display as claimed in claim 57 wherein said semiconductor layer and said first and second electrode layers are mounted on a substrate, and wherein said illumination channelling region includes said substrate.

59. An optoelectronic display as claimed in claim 58 wherein said illumination from said light source is substantially confined between a front surface of said substrate and the one of the first and electrode layers farthest from said front surface of said substrate.

60. An optoelectronic display as claimed in claim 58 wherein said illumination is internally reflected by total internal reflection at an internal front surface of said substrate.

61. An optoelectronic display comprising:
a semiconductor layer in the form of a film of organic photoluminescent material, a first electrode layer proximate a first surface of the semiconductor layer, and a second electrode layer proximate a second surface of the semiconductor layer;
a substrate carrying said semiconductor layer and said first and second electrode layers; and
an optical structure on said substrate to collect and deliver light from said photoluminescent material to a viewer of the display, the organic photoluminescent material of the display having a normally-on, photoluminescence emissive state under zero bias across the electrode layers.

62. An optoelectronic device as claimed in claim 61 wherein said optical structure comprises a plurality of microlenses.

63. A pixellated optoelectronic display comprising a plurality of photoluminescent display devices each associated with a pixel of the display and having a pair of electrodes for addressing the device, and device driver circuitry for driving the electrodes to control the display, the pixels of the display having a normally-on, photoluminescence emissive state under zero bias across the electrodes, the display driver circuitry being configured to apply bias voltage to inhibit said photoluminescent emission from selected pixels of the display, to thereby display information.

64. A pixellated optoelectronic display as claimed in claim 63 wherein said photoluminescent display devices comprise organic photoluminescent diodes, and wherein said bias voltage reverse biasses said diodes to inhibit said photoluminescent, emission.

65. A pixellated optoelectronic display as claimed in claim 63 wherein said bias voltage is variable to variably inhibit said photoluminescent emission.

66. A pixellated optoelectronic display as claimed in claim 63 comprising photoluminescent devices with a plurality of different colors whereby different pixels of the display are capable of displaying different colors.

67. A pixellated optoelectronic display as claimed in claim 62, wherein said applied bias voltage has a variable duty cycle waveform and wherein the device driver circuitry has a display data input for controlling the relative brightness of said pixels, said device driver circuitry further comprising at least one variable duty cycle waveform generator responsive to said display data input to vary the duty cycle of the bias voltage waveform applied to a said pixel.

68. An optoelectronic display operating on the principle of quenched photoluminescence, the display comprising:
a first electrode;
a second electrode; and
a visible display element located between the first and second electrodes, the display element comprising photoluminescent material,
the display being configured to at least partially quench photoluminescence from said photoluminescent material upon application of a voltage between said first and second electrodes and thereby visibly change from a photoluminescent emissive state to a reduced emissivity state to provide a visual display, the organic photoluminescent material of the display having a normally-on, photoluminescence emissive state under zero bias across the electrode layers.

69. An optoelectronic display as claimed in claim 68 wherein said reduced emissivity state is a state in which, by comparison with said photoluminescent emissive state, visible photoluminescent emissivity from the photoluminescent material is substantially zero.

70. An optoelectronic display as claimed in claim 68 wherein said photoluminescent material is substantially visually colorless in said reduced emissivity state.

71. An optoelectronic display as claimed in claim 70 comprising a plurality of said visible display elements and a corresponding plurality of at least one of said first and second electrodes, a first subset of said visible display elements comprising a first photoluminescent material having a first color in said photoluminescent emissive state and a second subset of said visible display elements comprising a second photoluminescent material having a second color in said photoluminescent state, the visible display elements of said first subset being arranged near the visible display elements of said second subset, whereby the effect of a variable color display is created.

72. An optoelectronic display in claim 71 wherein a third subset of said visible display elements comprises a third photoluminescent material having a third color, the visible display elements of said third subset being arranged near the visible display elements of said second subset.

73. An optoelectronic display as claimed in claim 68 wherein one of said first and second electrodes is at least partially visually transparent.

74. An optoelectronic display as claimed in claim 73 wherein both said first and second electrodes are at least partially visually transparent.

75. An optoelectronic display as claimed in claim 68 wherein said first electrode, said second electrode and said photoluminescent material are selected such that the conductivity between the electrodes is greater when said first electrode is positive with respect to said second electrode, and wherein said second electrode is the positive electrode of said display and said first electrode is the negative electrode of the display.

76. An optoelectronic display as claimed in claim 68 further comprising a first wire connected to said first electrode and a second wire is connected to said second electrode, wherein the display is photoluminescent when said photoluminescent material is illuminated and said photoluminescence is at least partially quenched when said first electrode is negative with respect to said second electrode, and wherein at least one of said first and second wires is marked to indicate that said second wire is to be positive with respect to said first wire to drive the display element off.

77. An optoelectronic display as claimed in claim 68 further comprising instructions that said second wire is to be positive with respect to said first wire to drive the display element off.

78. A combination of an optoelectronic display device and instructions, the display device comprising:
  a semiconductor layer in the form of a film of organic photoluminescent material, a first electrode layer proximate a first surface of the semiconductor layer, and a second electrode layer proximate a second surface of the semiconductor layer;
  the instructions comprising instructions to apply an electric field between the first and second contact layers across the semiconductor layer so as to render the second contact layer negative relative to the first contact layer to inhibit photoluminescence from said photoluminescent film, the organic photoluminescent material of the display having a normally-on, photoluminescence emissive state under zero bias across the electrode layers.

* * * * *

UNITED STATES PATENT AND TRADEMARK OFFICE
CERTIFICATE OF CORRECTION

| | | |
|---|---|---|
| PATENT NO. | : 7,537,947 B2 | Page 1 of 1 |
| APPLICATION NO. | : 10/488419 | |
| DATED | : May 26, 2009 | |
| INVENTOR(S) | : Euan C. Smith et al. | |

It is certified that error appears in the above-identified patent and that said Letters Patent is hereby corrected as shown below:

In the Specification:

At Column 21, line 66, "is" should be -- first --

In the Claims:

At Column 26, line 40, "dens" should be -- dense --

Signed and Sealed this

Ninth Day of March, 2010

David J. Kappos
*Director of the United States Patent and Trademark Office*